United States Patent
Kim et al.

(10) Patent No.: US 9,865,474 B2
(45) Date of Patent: *Jan. 9, 2018

(54) ETCHING METHOD USING PLASMA, AND METHOD OF FABRICATING SEMICONDUCTOR DEVICE INCLUDING THE ETCHING METHOD

(71) Applicant: Samsung Electronics Co., Ltd., Suwon-si, Gyeonggi-do (KR)

(72) Inventors: Gon-jun Kim, Suwon-si (KR); Vladimir Volynets, Suwon-si (KR); Sang-jin An, Suwon-si (KR); Hee-jeon Yang, Suwon-si (KR); Sangheon Lee, Seongnam-si (KR); Sung-keun Cho, Seoul (KR); Xinglong Chen, Seongnam-si (KR); In-ho Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/347,331

(22) Filed: Nov. 9, 2016

(65) Prior Publication Data

US 2017/0062235 A1    Mar. 2, 2017

Related U.S. Application Data

(63) Continuation of application No. 14/819,904, filed on Aug. 6, 2015, now Pat. No. 9,520,301.

(60) Provisional application No. 62/066,510, filed on Oct. 21, 2014.

(51) Int. Cl.
*H01L 21/302* (2006.01)
*H01L 21/461* (2006.01)
*H01L 21/311* (2006.01)
*H01J 37/32* (2006.01)
*H01L 21/02* (2006.01)
*H01L 21/3065* (2006.01)

(52) U.S. Cl.
CPC .. *H01L 21/31116* (2013.01); *H01J 37/32357* (2013.01); *H01L 21/02046* (2013.01); *H01L 21/3065* (2013.01)

(58) Field of Classification Search
USPC ........................................................ 438/724
See application file for complete search history.

(56) References Cited

U.S. PATENT DOCUMENTS

| | | | |
|---|---|---|---|
| 6,051,504 A | 4/2000 | Armacost et al. | |
| 6,740,247 B1 | 5/2004 | Han et al. | |
| 7,276,447 B1 | 7/2007 | Delgadino | |
| 7,452,823 B2 | 11/2008 | Sato | |
| 7,513,981 B2 | 4/2009 | Miura et al. | |
| 7,695,567 B2 | 4/2010 | Fu | |
| 7,867,923 B2 | 1/2011 | Mallick et al. | |
| 8,236,706 B2 | 8/2012 | Peuse et al. | |

(Continued)

FOREIGN PATENT DOCUMENTS

| | | |
|---|---|---|
| JP | 06-216132 | 8/1994 |
| JP | 10-261616 | 9/1998 |

(Continued)

*Primary Examiner* — Roberts Culbert
(74) *Attorney, Agent, or Firm* — Myers Bigel, P.A.

(57) ABSTRACT

An etching method using plasma includes generating plasma by supplying process gases to at least one remote plasma source (RPS) and applying power to the at least one RPS, and etching an etching object by supplying water ($H_2O$) and the plasma to a process chamber.

12 Claims, 31 Drawing Sheets

(56) References Cited

U.S. PATENT DOCUMENTS

| | | |
|---|---|---|
| 8,771,539 B2 | 7/2014 | Zhang et al. |
| 2006/0205216 A1 | 9/2006 | Sato |
| 2008/0153306 A1 | 6/2008 | Cho et al. |
| 2009/0104782 A1 | 4/2009 | Lu et al. |
| 2012/0238102 A1 | 9/2012 | Zhang et al. |
| 2013/0045605 A1 | 2/2013 | Wang et al. |
| 2013/0048605 A1 | 2/2013 | Sapre |
| 2013/0059440 A1 | 3/2013 | Wang et al. |
| 2013/0089988 A1 | 4/2013 | Wang et al. |
| 2013/0130506 A1 | 5/2013 | Wang et al. |
| 2015/0155178 A1 | 6/2015 | Kim et al. |

FOREIGN PATENT DOCUMENTS

| | | |
|---|---|---|
| JP | 2001-345307 | 12/2001 |
| JP | 2006-253222 | 9/2006 |
| JP | 2008-235632 | 10/2008 |
| JP | 2011-171378 | 9/2011 |
| KR | 1020050094183 | 9/2005 |
| KR | 100746570 | 7/2007 |
| KR | 1020150065025 | 6/2015 |

ETCHING METHOD USING PLASMA, AND METHOD OF FABRICATING SEMICONDUCTOR DEVICE INCLUDING THE ETCHING METHOD

CROSS-REFERENCE TO RELATED APPLICATIONS

This application is a continuation of U.S. patent application Ser. No. 14/819,904, filed Aug. 6, 2016 claims priority to U.S. Provisional Patent Application No. 62/066,510, filed on Oct. 21, 2014, in the U.S. Patent and Trademark Office, the disclosure of which is incorporated herein in its entirety by reference.

BACKGROUND

The inventive concept relates to a method of fabricating a semiconductor device, and more particularly, to an etching method using plasma and a method of fabricating a semiconductor device including the etching method.

In general, a series of processes including depositions, etching, cleansing, etc. may be performed to fabricate a semiconductor device. The processes may be performed by depositions, etching, or cleaning apparatuses having process chambers. For example, the etching process is performed in an etching apparatus having its corresponding process chamber. In the etching process, a film to be etched in the etching process has a high etch rate, whereas a film to not be etched in the etching process has a low etch rate. Also, damage to the film in the etching process is reduced or avoided. To embody the above, direct plasma technology such as capacitive coupled plasma (CCP) or inductively coupled plasma (ICP) is employed. The direct plasma technology or direct plasma includes technology to directly generate plasma in a process chamber that is a wafer processing space or plasma generated thereby. However, when the direct plasma is used, the improvement of selectivity in an etching process may be restricted. Also, even a film that does not require etching may be damaged.

SUMMARY

The inventive concept provides an etching method using plasma which may improve selectivity in an etching process and also may reduce damage to a film, and a method of fabricating a semiconductor device including the etching method.

According to an aspect of the inventive concept, there is provided an etching method using plasma, which includes generating plasma by supplying process gases to at least one remote plasma source (RPS) and applying power to the at least one RPS, and etching an etching object by supplying water ($H_2O$) and the plasma to a process chamber.

In some embodiments, the water is supplied during a pretreatment step performed on the etching object before an etching process or in the form of vapor during the etching process. The pretreatment step may be performed by placing the etching object with water in a sealed space or spraying steam toward the etching object.

In some embodiments, the at least one RPS comprises at least two RPS's and the water is supplied in the form of vapor to at least one of the RPS's, at least one path between the RPS's and the process chamber, a shower head arranged in an upper portion of an inside of the process chamber, and an entrance connected to the process chamber.

According to another aspect of the inventive concept, there is provided an etching method using plasma, which includes generating plasma by supplying process gases to at least one remote plasma source (RPS) and applying power to the at least one RPS, and etching an etching object by supplying hydrogen ($H_2$) and the plasma to a process chamber.

In some embodiments, the at least one RPS comprises at least two RPS's and the water is supplied in the form of vapor to at least one of the RPS's, at least one path between the RPS's and the process chamber, a shower head arranged in an upper portion of an inside of the process chamber, and an entrance connected to the process chamber.

In some embodiments, supplying process gases comprises supplying nitrogen trifluoride ($NF_3$) to at least one of the RPS's, and hydrogen ($H_2$) is supplied to satisfy the equation, $$[NF_3]*D:[H_2]=2:3,$$

wherein "$[NF_3]$" denotes a flow rate of $NF_3$, "$[H_2]$" denotes a flow rate of $H_2$, and "D" denotes a degree of dissociation of $NF_3$.

According to another aspect of the inventive concept, there is provided an etching method using plasma, which includes generating plasma by supplying process gases to at least one remote plasma source (RPS) and applying power to the at least one RPS, and etching an etching object by supplying water ($H_2O$) and hydrogen ($H_2$) to a process chamber with the plasma.

In some embodiments, the water is supplied during a pretreatment step performed on the etching object before an etching process or in the form of vapor during the etching process. The pretreatment step may be performed by placing the etching object with water in a sealed space or spraying steam toward the etching object.

In some embodiments, the at least one RPS comprises at least two RPS's and the water is supplied in the form of vapor to at least one of the RPS's, at least one path between the RPS's and the process chamber, a shower head arranged in an upper portion of an inside of the process chamber, and an entrance connected to the process chamber.

In some embodiments, supplying process gases comprises supplying nitrogen trifluoride ($NF_3$) to at least one of the RPS's, and hydrogen ($H_2$) is supplied to satisfy the equation, $$[NF_3]*D:[H_2]=2:3,$$

wherein "$[NF_3]$" denotes a flow rate of $NF_3$, "$[H_2]$" denotes a flow rate of $H_2$, and "D" denotes a degree of dissociation of $NF_3$.

In some embodiments, the at least one RPS comprises at least two RPS's, and $NF_3$, $N_2$, and $O_2$ are supplied to a first RPS of the RPS's and $O_2$ and $N_2$ are supplied to a second RPS of the RPS's.

In some embodiments, etching the etching object comprises selectively etching among a silicon nitride ($Si_3N_4$) film and at least one of a polysilicon (p-Si) film and a silicon oxide ($SiO_2$) film, the silicon nitride ($Si_3N_4$) film.

According to another aspect of the inventive concept, there is provided an etching method using plasma, which includes generating plasma by supplying process gases to a process chamber and applying power to the process chamber, and etching an etching object by supplying at least one of water ($H_2O$) and hydrogen ($H_2$) to the process chamber with the plasma.

In some embodiments, the water is supplied through a pretreatment step performed on the etching object before an etching process or in the form of vapor during the etching process.

In some embodiments, the supply of the water during the pretreatment step is provided by placing the etching object with water in a sealed space or spraying steam toward the etching object.

In some embodiments, the supply of the water in the form of vapor is supplied during the etching process by supplying the water in the form of vapor to a shower head arranged in an upper portion of the process chamber or to an entrance connected to the process chamber.

In some embodiments, the hydrogen is supplied to a shower head arranged in an upper portion of the process chamber or to an entrance connected to the process chamber.

In some embodiments, supplying process gases comprises supplying nitrogen trifluoride ($NF_3$), and hydrogen ($H_2$) satisfy the equation, $$[NF_3]*D:[H_2]=2:3,$$

wherein "$[NF_3]$" denotes a flow rate of $NF_3$, "$[H_2]$" denotes a flow rate of $H_2$, and "D" denotes a degree of dissociation of $NF_3$.

According to another aspect of the inventive concept, there is provided a method of fabricating a semiconductor device, which includes generating plasma by supplying process gases to at least one remote plasma source (RPS) or a process chamber and applying power to the at least one RPS or the process chamber, etching an etching object in the process chamber by using at least one of water ($H_2O$) and hydrogen ($H_2$), and the plasma, and performing a subsequent semiconductor process on the etching object.

In some embodiments, the water and the hydrogen are supplied to the process chamber, and the water is supplied to the process chamber during a pretreatment step of the etching object before an etching process or in the form of vapor during the etching process.

In some embodiments, the plasma is generated in the at least one RPS, the at least one RPS comprises two RPS's, and at least one of the water and hydrogen is supplied to at least one of the RPS's, at least one path between the two RPS's and the process chamber, a shower head arranged in an upper portion of the process chamber, and an entrance connected to the process chamber.

In some embodiments, the plasma is generated in the process chamber, and at least one of the water and hydrogen is supplied to a shower head arranged in an upper portion of the process chamber, and to an entrance connected to the process chamber.

In some embodiments, supplying the process gases comprises supplying nitrogen trifluoride ($NF_3$), and hydrogen ($H_2$) to satisfy the equation, $$[NF_3]*D:[H_2]=2:3,$$

wherein "$[NF_3]$" denotes a flow rate of $NF_3$, "$[H_2]$" denotes a flow rate of $H_2$, and "D" denotes a degree of dissociation of $NF_3$.

In some embodiments, etching the etching object comprises selectively etching a silicon nitride ($Si_3N_4$) film and at least one of a polysilicon (p-Si) film and a silicon oxide ($SiO_2$) film, the silicon nitride ($Si_3N_4$) film.

According to another aspect of the inventive concept, an etching method includes generating a plasma; and supplying at least one of water ($H_2O$) and hydrogen ($H_2$) to an etching object in a process chamber in a presence of the plasma to etch the etching object.

In some embodiments, generating a plasma comprises supplying one or more process gasses to at least one remote plasma source (RPS) and applying power to the RPS.

In some embodiments, generating a plasma comprises supplying one or more process gasses to the process chamber and applying power to the process chamber.

In some embodiments, supplying at least one of water ($H_2O$) and hydrogen ($H_2$) to the etching object comprises a water vapor to the process chamber In some embodiments, the at least one RPS comprises at least two RPS's, and hydrogen is supplied to at least one of the RPS's, a path between the RPS's and the process chamber, a shower head arranged in an upper portion of an inside of the process chamber, and an entrance connected to the process chamber.

In some embodiments, supplying process gases comprises supplying nitrogen trifluoride ($NF_3$) to at least one of the RPS's, and hydrogen ($H_2$) is supplied to satisfy the equation, $$[NF_3]*D:[H_2]=2:3,$$

wherein "$[NF_3]$" denotes a flow rate of $NF_3$, "$[H_2]$" denotes a flow rate of $H_2$, and "D" denotes a degree of dissociation of $NF_3$.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
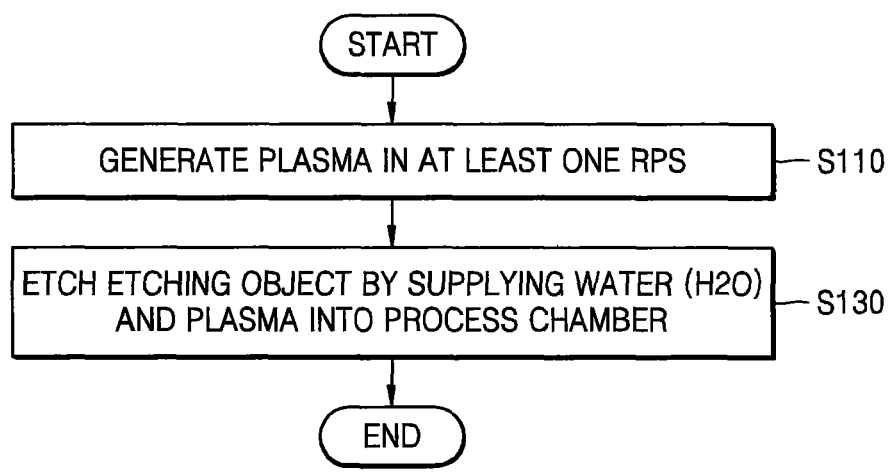
FIG. 1 is a flowchart illustrating an etching method using plasma, according to an exemplary embodiment.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

Exemplary embodiments are provided to further completely explain the present inventive concept to one of ordinary skill in the art to which the present inventive concept pertains. However, the present inventive concept is not limited thereto, and it will be understood that various changes in form and details may be made therein without departing from the spirit and scope of the following claims. That is, descriptions on particular structures or functions may be presented merely for explaining exemplary embodiments of the present inventive concept.

In the following descriptions, when an element is described to be connected to another element, the element may be connected directly to the other element or a third element may be interposed therebetween. Similarly, when an element is described to exist on another element, the element may exist directly on the other element or a third element may be interposed therebetween. Also, the structure or size of each element illustrated in the drawings may be exaggerated for convenience of explanation and clarity. In the drawings, a part that is not related to a description is omitted to clearly describe the present inventive concept. Like references indicate like elements in the drawings. Terms used in the present specification are used for explaining a specific exemplary embodiment, not for limiting the present inventive concept.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

FIG. 1 is a flowchart for explaining an etching method using plasma, according to an exemplary embodiment.

Referring to FIG. 1, in the etching method using plasma according to the present exemplary embodiment, plasma is generated in at least one remote plasma source (RPS) (refer to 130 of FIG. 5) (S110). Plasma may be generated by supplying a required process gas to the RPS and applying appropriate power to the RPS under conditions of optimal pressure and temperature. Alternatively, a plurality of RPS's may be provided and, as an applicable process gas and power are supplied to the RPS's, respectively, different types of plasma may be generated in the RPS's.

Figure 5:
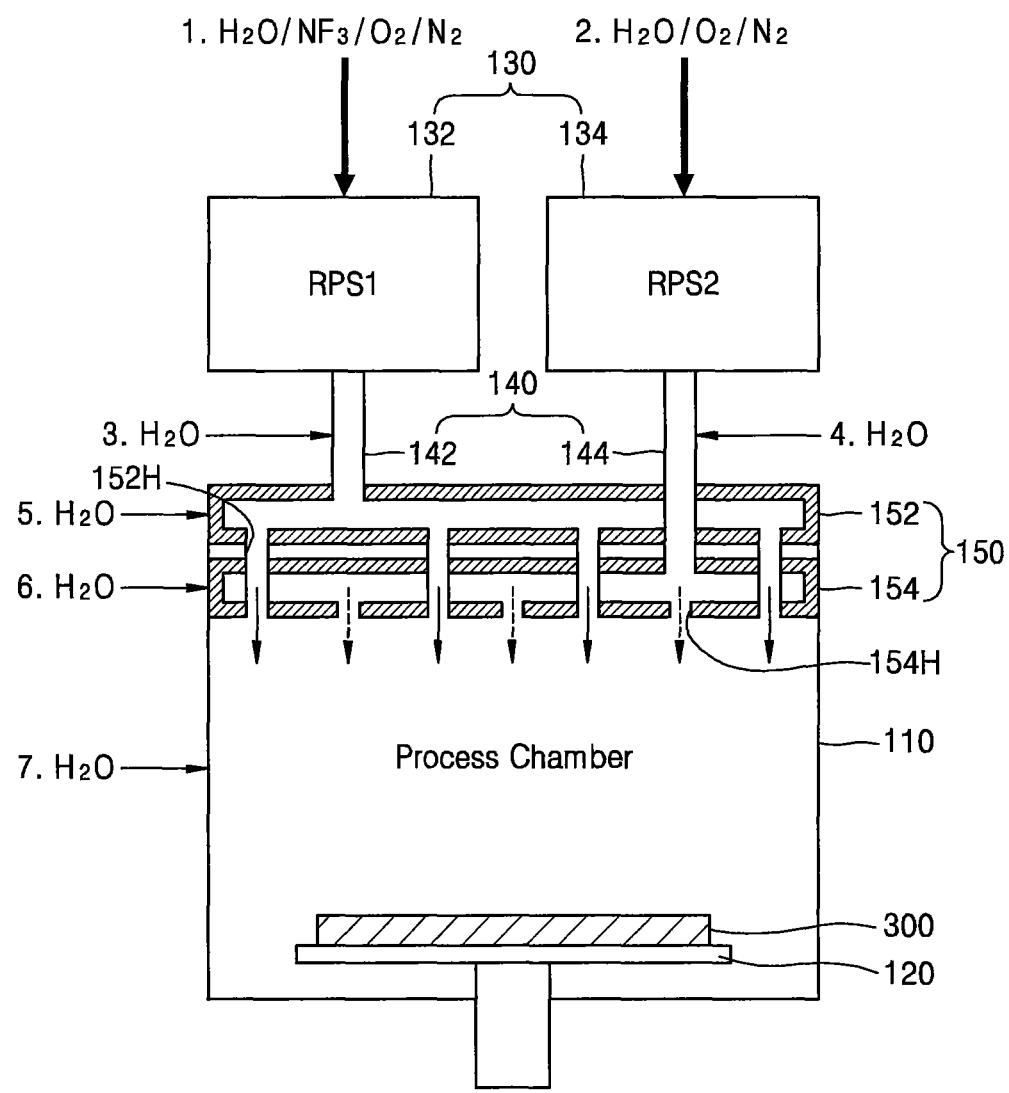
FIG. 5 is a schematic illustration of a structure of a semiconductor device fabrication apparatus having a remote plasma source (RPS) to show a concept of supplying water to a process chamber in the etching method of FIG. 4.

In detail, for example, a semiconductor device fabrication apparatus used for the etching method using plasma may include the RPS, and the RPS may be arranged outside a process chamber (refer to 110 of FIG. 5). As a predetermined process gas and power are applied to the RPS, plasma may be generated. In the etching method using plasma according to the present exemplary embodiment, the semiconductor device fabrication apparatus may be an etching apparatus or a cleaning apparatus. In this state, the semiconductor device fabrication apparatus is not limited to an etching apparatus or a cleaning apparatus. Accordingly, the process gas may include at least one source gas for etching or cleaning. For example, the process gas may include a fluorine (F)-based source gas, for example, $NF_3$, $CF_4$, etc.

For reference, the etching method using plasma according to the present inventive concept may include a cleaning method using plasma. Accordingly, although the following description discusses etching for clarity and convenience of explanation, the same method or principle of the etching may be applied to a cleaning process and the same effect of the etching processes described herein may be obtained in a cleaning process.

The RPS may generate plasma from the process gas under a predetermined process condition. The predetermined process condition may be a process condition optimized for generating plasma from the process gas. Plasma may be used, for example, for etching an etching object. The etching object may be, for example, a substrate or a material film on the substrate. The process condition may vary according to the type of a process gas. The process condition may include a pressure condition, a temperature condition, etc. in the RPS. A power application method may contribute to the generation and control of plasma. For example, to generate plasma, an electromagnetic wave having a predetermined frequency and power may be applied to the RPS in the form of a continuous wave CW or by being pulsed, with an on-off cycle. The power application method is described below in detail with reference to FIGS. 8A to 9B.

The plasma generated by the RPS may include a plurality of components. At least one of the components may be mainly used to etch the material film of the etching object. For example, the plasma may include radicals, ions, electrons, ultraviolet light, etc. The radicals may isotropically etch the etching object. In contrast, the ions may anisotropically etch the etching object. This may be based on the fact that, while the radicals are electrically neutral, the ions are electrically polarized.

Accordingly, when the etching object is completely etched to a predetermined thickness, that is, isotropically etched, the radicals may be mainly used. In the above isotropical etching process, since the ions, the electrons, the ultraviolet light, etc. may damage the etching object, they may be excluded from the plasma. In other words, when plasma is supplied to the process chamber through a shower head portion (refer to 150 of FIG. 5), only the radicals may be supplied to the process chamber by excluding the ions, the electrons, the ultraviolet light, etc.

Alternatively, in the etching method using plasma according to the present exemplary embodiment, plasma may be generated by using two or more RPS's. For example, two RPS's are arranged outside the process chamber. A first power is applied to a first RPS to generate first plasma from a first process gas. A second power is applied to a second RPS to generate second plasma from a second process gas. The first process gas may be different than the second process gas. For example, the first process gas may include an F-based source gas and the second process gas may include an oxygen (O)-based source gas. Although the first process gas is described as being different from the second process gas, in some cases, the first process gas may be identical to the second process gas.

When the first process gas and the second process gas are different from each other, first process conditions in the first RPS may be different than second process conditions in the second RPS. In other words, the first plasma may be generated in the first RPS under the first process conditions, and the second plasma may be generated in the second RPS under the second process conditions that are different from the first process conditions. The first process conditions and the second process conditions may be changed according to the types of the first process gas and the second process gas. Each of the first process conditions and the second process conditions may include a pressure condition, a temperature condition, etc. In terms of power, in order to generate the first plasma in the first RPS, a first electromagnetic wave having a first frequency and the first power may be applied to the first RPS in the form of a continuous wave or by being pulsed, with a first on-off cycle. Also, in order to generate the second plasma in the second RPS, a second electromagnetic wave having a second frequency and the second power may be applied to the second RPS in the form of a continuous wave with or by being pulsed, with a second on-off cycle. Here, the second frequency, the second power, and the second on-off cycle of the second electromagnetic wave may be the same as or different from the first frequency, the first power, and the first on-off cycle of the first electromagnetic wave. For example, while the second frequency is identical to the first frequency, and the second on-off cycle is identical to the first on-off cycle, the second power may be different than the first power. The power application method is described below in detail with reference to FIGS. 8A to 9B.

Each of the first plasma generated in the first RPS and the second plasma generated in the second RPS may include a plurality of components. At least one of the components is mainly used to etch the etching object. For example, while the first plasma may include first radicals, first ions, electrons, ultraviolet light, etc., the second plasma may include second radicals, second ions, electrons, ultraviolet light, etc. The first radicals and the second radicals may isotropically etch the etching object. In contrast, the first ions and the second ions may anisotropically etch the etching object.

Accordingly, when the etching object is isotropically etched, the first ions, the electrons, the ultraviolet light, etc. may be excluded from the first plasma and the second ions, the electrons, the ultraviolet light, etc. may be excluded from the second plasma. In other words, when the first and second plasmas are supplied to the process chamber through the shower head portions, only the first radicals and the second radicals may be supplied to the process chamber, minus the first ions, the second ions, electrons, ultraviolet light, etc.

After the plasma is generated, water ($H_2O$) and the plasma generated in the RPS are supplied to the process chamber and thus the etching object is etched (S130). A method of supplying water to the process chamber may generally include a pretreatment method in which the etching object, for example, a wafer, is pretreated with water and the pretreated wafer is arranged in the process chamber and a direct supply method in which water is supplied to the process chamber in the form of vapor via a variety of paths. In the case of the pretreatment method, the pretreatment of the etching object by using water is generally performed before the generation of plasma. In the direct supply method, water in the form of vapor may be supplied in various steps before the generation of plasma, simultaneously with the generation of plasma, and after the generation of plasma. Accordingly, although as illustrated in FIG. 1, water and plasma are supplied to the process chamber after the generation of plasma and then the etching object is etched, such a sequence is merely for convenience of explanation, and the supply of water may be performed before or simultaneously with the generation of plasma.

The method of supplying water in the pretreatment method is described below in detail with reference to FIGS. 2 to 3B and the method of supplying water in the direct supply method is described below in detail with reference to FIGS. 4 and 5.

Since the etching object is etched by supplying water with plasma to the process chamber, the etching efficiency with respect to the etching object may be improved. For example, an etch rate of the etching object may be increased and a selectivity of the etching object may also be increased. The etch rate may be defined to be a thickness of the etching object being etched per minute, and the selectivity may be defined to be an "Etch rate of etching object"/"Etch rate of non-etching object." The effect or efficiency in the etching of the etching object by supplying water with plasma to the process chamber is described below in detail with reference to FIGS. 6 and 7.

In the etching method using plasma according to the present exemplary embodiment, since at least one RPS generates plasma and water and the plasma are supplied to the process chamber to etch the etching object, etching efficiency with respect to the etching object, for example, an etch rate and a selectivity of the etching object, may be increased.

Figure 2:
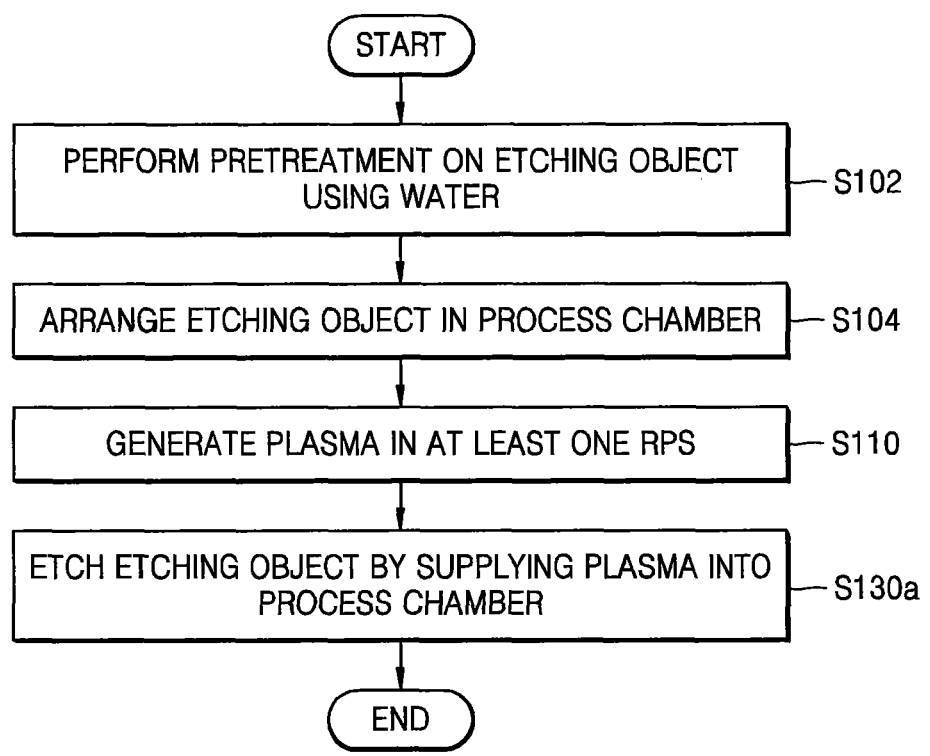
FIG. 2 is a flowchart illustrating in detail the etching method of FIG. 1.

FIG. 2 is a flowchart illustrating in detail the etching method using plasma of FIG. 1. For convenience of explanation, the descriptions provided above with reference to FIG. 1 are briefly provided or omitted.

Referring to FIG. 2, in the etching method using plasma according to the present exemplary embodiment, a pretreatment of the etching object using water is first performed (S102). The pretreatment of the etching object may mean processing the etching object, for example, a wafer with water, in advance before the wafer is arranged in the process chamber. The pretreatment of the etching object may basically mean depositing water in the form of vapor on a surface of the etching object. The pretreatment of the etching object is described below in detail with reference to FIGS. 3A and 3B.

The pretreated etching object is arranged in the process chamber (S104). The etching object may be arranged on an upper surface of a stage (refer to 120 of FIG. 5) located in a lower portion of the process chamber. The stage may support the etching object during an etching process, and also the stage may function as an electrode during the etching process. For example, when a bias is applied during the etching process, the stage may function as an electrode to apply a bias to the process chamber.

After the arrangement of the etching object in the process chamber, at least one RPS generates plasma (S110). The plasma is generated in the RPS as described above with reference to FIG. 1.

Then, the plasma generated in at least one of the RPS's is supplied to the process chamber and thus the etching object is etched (S130a). Although, in the exemplary embodiment of FIG. 1, water and plasma together are supplied to the process chamber, in the present exemplary embodiment, water is already supplied to the process chamber when the pretreated etching object is arranged in the process chamber. Accordingly, only the plasma is supplied in the etching operation (S130a). In other words, the etching operation (S130) of the exemplary embodiment of FIG. 1 may correspond to both the arrangement operation (S104) and the etching operation (S130a). Since the etching operation (S130a) of the present exemplary embodiment is described above with reference to FIG. 1, the same descriptions thereof are omitted.

Figure 3A:
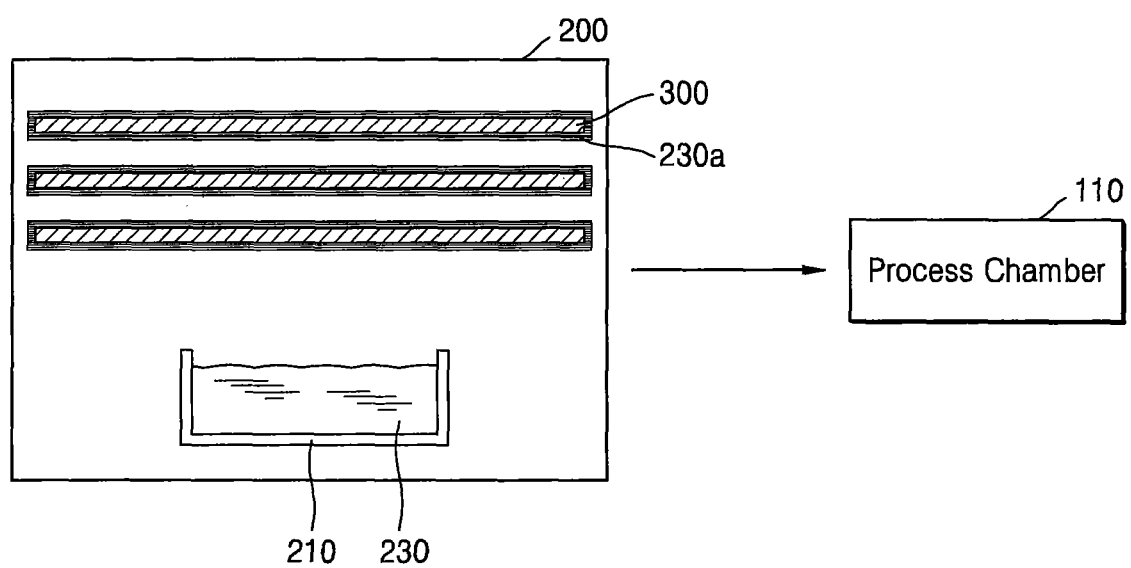
FIGS. 3A and 3B are schematic diagrams illustrating a pretreatment process on an etching object by water ($H_2O$) in the etching method of FIG. 2.
Figure 3B:
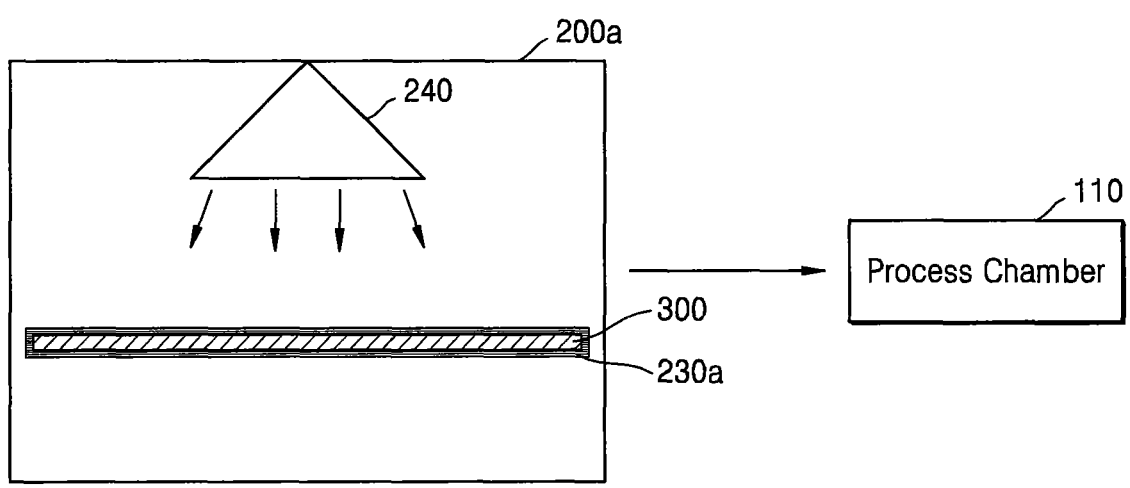

FIGS. 3A and 3B are conceptual views illustrating a pretreatment process on an etching object using water in the etching method using plasma of FIG. 2.

Referring to FIG. 3A, an etching object, for example, a plurality of wafers 300, are kept in a container 200, which is sealed, for a predetermined time with a water reservoir 210 filled with water 230, thereby performing a pretreatment on the wafers 300. The wafers 300 may be kept in the container 200 with the water 230, for example, for 1 to 24 hours. However, the kept time is not limited thereto, and the wafers 300 may be kept less than 1 hour or more than 24 hours.

When the wafers 300 are kept in the container 200 with the water 230, vapor 230a evaporated from the water 230 may adhere on surfaces of the wafers 300. As the vapor 230a adheres on the surfaces of the wafers 300, the surfaces of the wafers 300 may be coated with the vapor 230a. The wafers 300 coated with the vapor 230a through the pretreatment are arranged in a process chamber 110 and thus an etching process using plasma may be performed. As described above, the arrangement of the wafers 300 coated with the vapor 230a in the process chamber 110 may correspond to the supplying of water to the process chamber 110 in the etching process using plasma.

The effect of the etching using plasma after the pretreatment of the wafers with water is described as follows: For example, when the etching process using plasma is performed on a silicon nitride ($Si_3N_4$) film without performing the pretreatment using water, an etch rate of about 116 Å/min may be measured. In contrast, when the pretreatment using water is performed with the other conditions remaining the same, an etch rate of about 201 Å/min may be measured. Accordingly, it may be seen that the etch rate increases by almost over 70%. Also, when the pretreatment using water is not performed, the selectivity of the silicon nitride film with respect to a polysilicon film may be about 19, and a selectivity of the silicon nitride film with respect to a silicon oxide ($SiO_2$) film may be about 29. In contrast, when the pretreatment using water is performed, the selectivity of the silicon nitride film with respect to the polysilicon film may be about 32 and the selectivity of the silicon nitride film with respect to the silicon oxide film may be about 134. Accordingly, the selectivity may be increased by performing the pretreatment using water. In particular, the selectivity of the silicon nitride film with respect to the silicon oxide film may increase by over four times. Thus, when the silicon oxide film and the silicon nitride film are included together, only the silicon nitride film may be very easily and stably etched by using plasma through the pretreatment using water.

Referring to FIG. 3B, as another pretreatment method, vapor or steam is sprayed by using a steam ejector 240 in a container 200a that is sealed and thus vapor 230a is coated on surfaces of the etching object, for example, the wafers 300, thereby performing a pretreatment on the wafers 300. As such, the method using the steam ejector 240 may be used for a case in which a pretreatment that is faster than the method of keeping wafers in a container with water is needed. For example, in the pretreatment using the steam ejector 240, the wafers 300 may be pretreated within several tens of seconds to several minutes. A time for the pretreatment using the steam ejector 240 is not limited to the above time, and any suitable time period may be used.

The wafers 300 coated with the vapor 230a through the pretreatment using the steam ejector 240 may be arranged in the process chamber 110 and thus the etching process using plasma may be performed. The arrangement of the wafers 300 coated with the vapor 230a in the process chamber 110 may correspond to the supplying of water to the process chamber 110 in the etching process using plasma.

Figure 4:
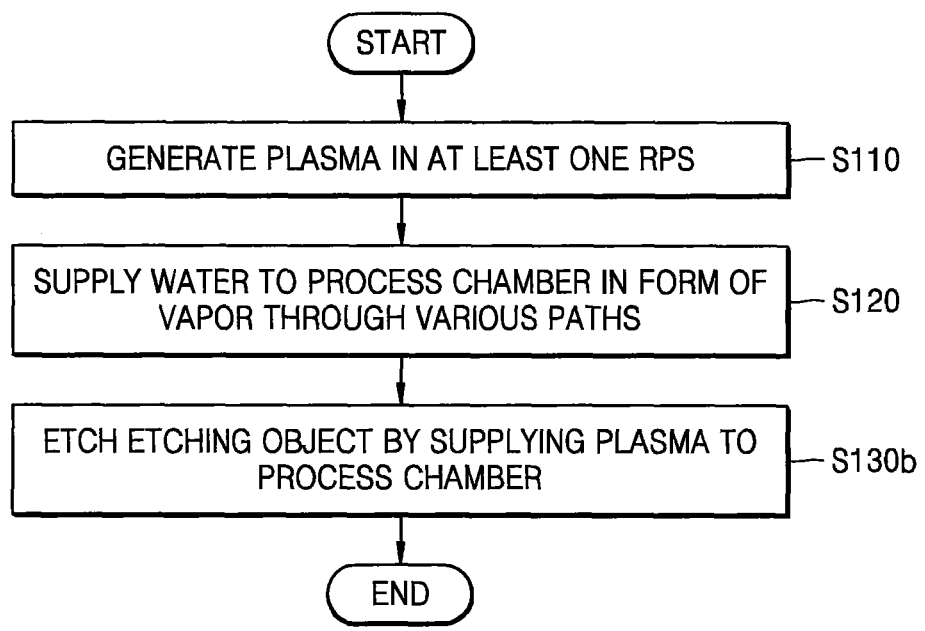
FIG. 4 is a flowchart for explaining in detail the etching method of FIG. 1.

FIG. 4 is a flowchart illustrating in detail the etching method using plasma of FIG. 1.

Referring to FIG. 4, the etching method using plasma according to the present exemplary embodiment first generates plasma in at least one RPS (S110). The generation of plasma in the RPS is generally the same as that described with reference to FIG. 1.

Next, water is supplied in the form of vapor to the process chamber through various paths (S120). For example, in FIGS. 2 to 3B, although water is supplied to the process chamber in the method of pretreating the etching object using water, in the present exemplary embodiment, a method of supplying water in the form of vapor to the process chamber during the etching process using plasma may be used. For example, during the etching process using plasma, water may be supplied in the form of vapor to at least one RPS. Also, water may be supplied in the form of vapor to a plasma supply path between the at least one RPS and a shower head, or the shower head. The water in the form of vapor supplied to the at least one RPS, the plasma supply path, or the shower head is finally supplied to the process chamber. Alternatively, in addition to the above-described methods, water may be supplied in the form of vapor directly to the process chamber through an entrance that is connected to the process chamber.

In addition, although FIG. 4 describes that water is supplied to the process chamber after plasma is generated, water may be supplied before or during the generation of plasma. The method of supplying water to the process chamber in the form of vapor during the etching process using plasma is described below in detail with reference to FIG. 5.

After supplying water to the process chamber (S120), plasma is supplied to the process chamber to etch the etching object (S130b). Alternatively, plasma may be supplied with water or separately from water. For example, in the supplying water to the process chamber (S120), when water is supplied in the form of vapor to the at least one RPS, the plasma supply path, or the shower head, plasma may be supplied to the process chamber with water. However, when water is supplied in the form of vapor to the process chamber through an entrance directly connected to the process chamber, plasma may be supplied to the process chamber separately from water.

Alternatively, as described above about the sequence between the generation of plasma and the supply of water, water may be supplied before, in the middle of, or after the generation of plasma. Accordingly, the supply of water may be performed before, in the middle of, or after the supply of plasma to the process chamber. Also, the supply of water may be maintained with the supply of plasma or may be discontinued after being supplied for a predetermined time, during the etching process. For example, water is supplied for first several tens of seconds and an existing process gas may be supplied for the rest of the time. Furthermore, water may be intermittently supplied during the etching process. In addition, when water is supplied in the form of vapor, the amount of water supplied may be adjusted using a mass flow controller (MFC) or an orifice.

In the etching method using plasma according to the present exemplary embodiment, plasma is generated in at least one RPS and water is supplied in the form of vapor to the process chamber with plasma, thereby etching the etching object. Thus, the etching efficiency with respect to the etching object, for example, an etch rate and a selectivity of the etching object, may be remarkably increased.

FIG. 5 is a schematic diagram illustrating a structure of a semiconductor device fabrication apparatus 100 having an RPS to show a concept of supplying water to a process chamber in the etching method using plasma of FIG. 4.

Referring to FIG. 5, the etching method using plasma according to the present exemplary embodiment may use the semiconductor device fabrication apparatus 100 having two RPS's. The semiconductor device fabrication apparatus 100 may include the process chamber 110, the stage 120, an RPS portion 130, and a shower head portion 150.

The semiconductor device fabrication apparatus 100 may be an apparatus that performs depositions, etching, and cleaning processes in a semiconductor device fabrication process. Accordingly, the process chamber 110 may be a chamber that is used for the depositions, etching, and cleaning processes in a semiconductor device fabrication process. In the etching method using plasma according to the present exemplary embodiment, the semiconductor device fabrication apparatus 100 may be an apparatus that performs an etching process, and the process chamber 110 may be a process chamber that performs an etching process. For example, the process chamber 110 may be a plasma etching chamber where an etching object is etched using plasma.

The etching object may be a substrate or a material film on the substrate. The substrate may be a semiconductor substrate including a semiconductor material. For example, the substrate may include a Group IV material or a Group III-V compound. Also, the substrate may be a single crystal wafer such as a silicon single crystal wafer. However, the substrate is not limited to a single crystal wafer and may be formed based on various wafers, for example, an epi or epitaxial wafer, a polished wafer, an annealed wafer, a silicon on insulator (SOI) wafer, etc. The epitaxial wafer means a wafer obtained by growing a crystal material on a single crystal silicon substrate.

Alternatively, the material film on the substrate may be an insulating film or a conductive film formed on the substrate through various methods, for example, deposition, coating, or plating. For example, the insulating film may be an oxide film, a nitride film, or an oxynitride film, and the conductive film may be a metal film or a polysilicon film. Alternatively, the material film may be a single film or a multi-film structure formed on an entire surface of the substrate. Also, the material film may be formed on the substrate in a predetermined pattern. Accordingly, in FIG. 5, the etching object 300 arranged on the stage 120 may be the substrate itself or a substrate structure including the material film on the substrate.

The stage 120 may be arranged in a lower portion of the process chamber 110. The etching object 300 to be etched may be placed on an upper surface of the stage 120. The stage 120 may support the etching object 300 during the etching process. Also, the stage 120 may function as an electrode during the etching process. For example, when a bias is applied to the process chamber 110 during the etching process, the stage 120 may function as an electrode.

Alternatively, as illustrated in FIG. 5, in the semiconductor device fabrication apparatus 100, plasma may not be generated directly in the process chamber 110 and may be generated in the RPS portion 130 and supplied to the process chamber 110. For reference, a CCP method or ICP method may be used as direct plasma technology for generating plasma directly in the process chamber 100. However, in the direct plasma technology, there may be a limit in improving the selectivity and a film that does not require etching may be damaged, as described above.

The RPS portion 130 may include a first RPS 132 and a second RPS 134. For reference, an RPS or an RPS apparatus (hereinafter, collectively referred to as the RPS) may be a sort of separate plasma chamber that is outside the process chamber 110 where etching is performed and generates plasma separately in the etching process. Although FIG. 5 illustrates that the RPS portion 130 includes two RPS's, the RPS portion 130 is not limited to two RPS's and may include three or more RPS's. Also, in some cases, the RPS portion 130 may include only one RPS.

The first RPS 132 may generate a first plasma from the first process gas with application of the first power under the first process conditions. The first process gas may include at least one source gas for etching. For example, the first process gas may include an F-based source gas, for example, $NF_3$, $CF_4$, etc. The first process gas may further include other process gases than the fluorine (F)-based gas, for example, $N_2$, $O_2$, $N_2O$, NO, Ar, He, $H_2$, etc. In the etching method using plasma according to the present exemplary embodiment, the first process gas may include $NF_3$, $N_2$, $O_2$, etc. However, the first process gas is not limited to the above-described gases, and any suitable process gas may be used.

The first process conditions may include a pressure condition, a temperature condition, etc. and may be changed according to the type of the first process gas. In order to generate the first plasma, the first electromagnetic wave having the first frequency and the first power may be applied to the first RPS in the form of a continuous wave or by being pulsed, with the first on-off cycle.

The generated first plasma may include a plurality of components. At least one of the components may be used for etching the etching object 300. For example, the first plasma may include the first radicals, the first ions, electrons, ultraviolet light, etc. As described above, while the first radicals may isotropically etch the etching object 300, the first ions may anisotropically etch the etching object 300. Accordingly, when the etching object 300 is isotropically etched, the first ions, electrons, ultraviolet light, etc. are excluded by the shower head portion 150 and only the first radicals may be provided to the process chamber 110.

The second RPS 134 may generate second plasma from the second process gas with the application of the second power under the second process conditions. The second process gas may include at least one source gas for etching. The second process gas may be different from the first process gas. However, a case in which the second process gas is the same as the first process gas may not be excluded, and the first and second process gases may be the same. For example, the second process gas may include an O-based gas, for example, $O_2$, $N_2O$, NO, etc. Also, the second process gas may further include other process gases than the O-based gas, for example, $N_2$, Ar, He, $H_2$, etc. The fluorine (F)-based gas such as $NF_3$ may be further included. In the etching method using plasma according to the present exemplary embodiment, the second process gas may include $N_2$, $O_2$, etc. However, the second process gas is not limited to the above-described gases, and any suitable process gas may be used.

The second process conditions may include a pressure condition, a temperature condition, etc. and may be changed according to the type of the second process gas. In order to generate the second plasma, the second electromagnetic wave having the second frequency and the second power may be applied to the second RPS in the form of a continuous wave or by being pulsed, with the second on-off cycle. The second electromagnetic wave may be identical to or different from the first electromagnetic wave in terms of at least one property. For example, the second electromagnetic wave may be identical to the first electromagnetic wave in terms of frequency and on-off cycle, but different from each other in terms of power.

The generated second plasma may include a plurality of components. At least one of the components may be used for etching the etching object 300. For example, the second plasma may include the second radicals, the second ions, electrons, ultraviolet light, etc. The second radicals may isotropically etch the etching object 300, whereas the second ions may anisotropically etch the etching object 300. Accordingly, when the etching object 300 is isotropically etched, similar to the first plasma, the second ions, electrons, ultraviolet light, etc. are excluded by the shower head portion 150 and only the second radicals may be provided to the process chamber 110.

The shower head portion 150 may include a first shower head 152 and a second shower head 154. The first shower head 152 and the second shower head 154 may be arranged to be spaced apart from each other. However, the structure of the shower head portion 150 is not limited to the structure of FIG. 5. For example, the shower head portion 150 may be formed as one body and have two separate spaces in an integrated structure, respectively performing functions of the first shower head 152 and the second shower head 154.

The first shower head 152 may be arranged in an upper portion of the inside of the process chamber 110. The first shower head 152 may be connected to the first RPS 132 through a first supply path 142 of a plasma supply path 140 and may receive the first plasma generated in the first RPS 132. Accordingly, the first shower head 152 may supply the first plasma generated in the first RPS 132 to the process chamber 110. For example, the first shower head 152 may spray the first plasma through a plurality of first holes 152H toward the etching object 300 placed on the stage 120 in the process chamber 110.

The first holes 152H may be formed in the first shower head 152. Each of the first holes 152H, which is a path connecting an inner space of the first shower head 152 and the process chamber 110, may extend from a lower surface of the first shower head 152 to be connected to the process chamber 110 by penetrating through the second shower head 154. For example, the first holes 152H may have a pipe structure penetrating through the second shower head 154.

The first holes 152H may have a size that substantially allows only the first radicals of the first plasma to pass while blocking most or all of the other components such as the first ions, electrons, etc. The size of the first holes 152H may be determined based on a concept of the Debye length to increase the number of first radicals of the first plasma to pass while blocking the other components. Alternatively, the first holes 152H may be grounded.

Accordingly, the when first plasma flows through the first holes 152H, substantially only the first radicals pass through the first holes 152H to be supplied to the process chamber 110. In contrast, the other components such as the first ions, electrons, etc. may not pass through the first holes 152H and thus the first ions, electrons, etc. may not be supplied to the process chamber 110. Accordingly, the etching object 300 may be prevented from being damaged by the first ions, electrons, etc. in the etching process. The size of each of the first holes 152H may be selected or changed according to the type of the first process gas. Since the first radicals are sprayed into the process chamber 110 through the first holes 152H, the first holes 152H may correspond to spray holes of the first shower head 152.

The second shower head 154 may also be arranged in the upper portion of the inside of the process chamber 110. Also, as illustrated in FIG. 5, the second shower head 154 may be arranged under the first shower head 152. The second shower head 154 may be connected to the second RPS 134 through a second supply path 144 of the plasma supply path 140, and may receive the second plasma generated in the second RPS 134. The second supply path 144 may have a structure of being connected to the second shower head 154 by penetrating through the first shower head 152. Accordingly, the second shower head 154 may supply the second plasma generated in the second RPS 134 to the process chamber 110. For example, the second shower head 154 may spray the second plasma generated in the second RPS 134 through a plurality of second holes 154H toward the etching object 300 placed on the stage 120 in the process chamber 110.

The second holes 154H may be formed in the second shower head 154. The second holes 154H may have a size that allows substantially only the second radicals of the second plasma to pass while blocking most or all of the other components such as the second ions, electrons, etc. The size of the second holes 154H may be determined based on a concept of the Debye length to increase the number of second radicals of the first plasma to pass while blocking the other components. Alternatively, the second holes 154H may be grounded.

Accordingly, the when second plasma flows through the second holes 154H, substantially only the second radicals pass through the second holes 154H to be supplied to the process chamber 110. In contrast, the other components such as the second ions, electrons, etc. may not pass through the second holes 154H and thus the second ions, electrons, etc. may not be supplied to the process chamber 110. Accordingly, the substrate or the material film on the substrate may be prevented from being damaged by the second ions, electrons, etc. in the etching process. The size of each of the second holes 154H may be selected or changed according to the type of the second process gas. Since the second radicals are sprayed into the process chamber 110 through the second holes 154H, the second holes 154H may correspond to spray holes of the second shower head 154.

The first holes 152H may be formed in a pipe structure penetrating through the second shower head 154. The space in the first holes 152H may be separated from an inner space of the second shower head 154. Accordingly, the first radicals may be sprayed directly toward the etching object 300 in the process chamber 110 through the first holes 152H without being mixed with the second radicals in the second shower head 154. The second radicals may be sprayed toward the etching object 300 in the process chamber 110 through the second holes 154H. As such, since the first radicals and the second radicals are separately supplied to the process chamber 110 through separated paths without being mixed with each other in advance, the quantity and type of the first radicals and the second radicals may be independently controlled. Accordingly, the etching process on the etching object 300 may be precisely controlled.

In addition, the etching object 300 may be anisotropically etched. In this case, the semiconductor device fabrication apparatus 100 according to the present exemplary embodiment may further include a bias application portion (not shown). The bias application portion may be electrically connected to the stage 120. The bias application portion may generate ions from the first radicals and the second radicals by applying a bias to the first radicals and the second radicals sprayed by the first and second shower heads 152 and 154. As the ions are applied to the etching object 300, the etching object 300 may be anisotropically etched.

In the etching method using plasma according to the present exemplary embodiment, water may be supplied to the process chamber 110 through various paths. For example, in the first path indicated by "1. $H_2O/NF_3/O_2/N_2$," water may be supplied to the first RPS 132 with $NF_3$, $O_2$, $N_2$, etc. that are the first process gas. In the second path indicated by "2. $H_2O/O_2/N_2$," water may be supplied to the second RPS 134 with $O_2$, $N_2$, etc. that are the second process gas. In the third path indicated by "3. $H_2O$," water may be supplied to the first supply path 142 with the first plasma generated in the first RPS 132. In the fourth path indicated by "4. $H_2O$," water may be supplied to the second supply path 144 with the second plasma generated in the second RPS 134. In the fifth path indicated by "5. $H_2O$," water may be supplied to the first shower head 152 with the first plasma from the first RPS 132. In the sixth path indicated by "6. $H_2O$," water may be supplied to the second shower head 154 with the second plasma generated in the second RPS 134. In the seventh path indicated by "7. $H_2O$," water may be supplied directly to the process chamber 110 through an entrance directly connected to the process chamber 110.

Alternatively, in the etching method using plasma according to the present exemplary embodiment, water may be supplied to the process chamber 110 through any one of the above-described seven paths or through two or more paths of the seven paths.

According to the etching method using plasma according to the present exemplary embodiment, since the first and second plasma are independently generated by using two RPS's arranged to be spaced apart from the process chamber 110 and supplied to the process chamber 110, the quantity and type of the plasma may be independently and precisely controlled in the semiconductor device fabrication process such as deposition, etching, cleaning, etc. Accordingly, the etching of the etching object 300 may be uniformly and precisely controlled in the semiconductor device fabrication process, for example, an etching process.

Also, in the etching method using plasma according to the present exemplary embodiment, since plasma is generated in at least one RPS and the generated plasma is provided to the process chamber, and also, water is supplied to the process chamber through various paths, the etching efficiency with respect to the etching object, for example, an etch rate and a selectivity of the etching object, may be increased.

Figure 6:
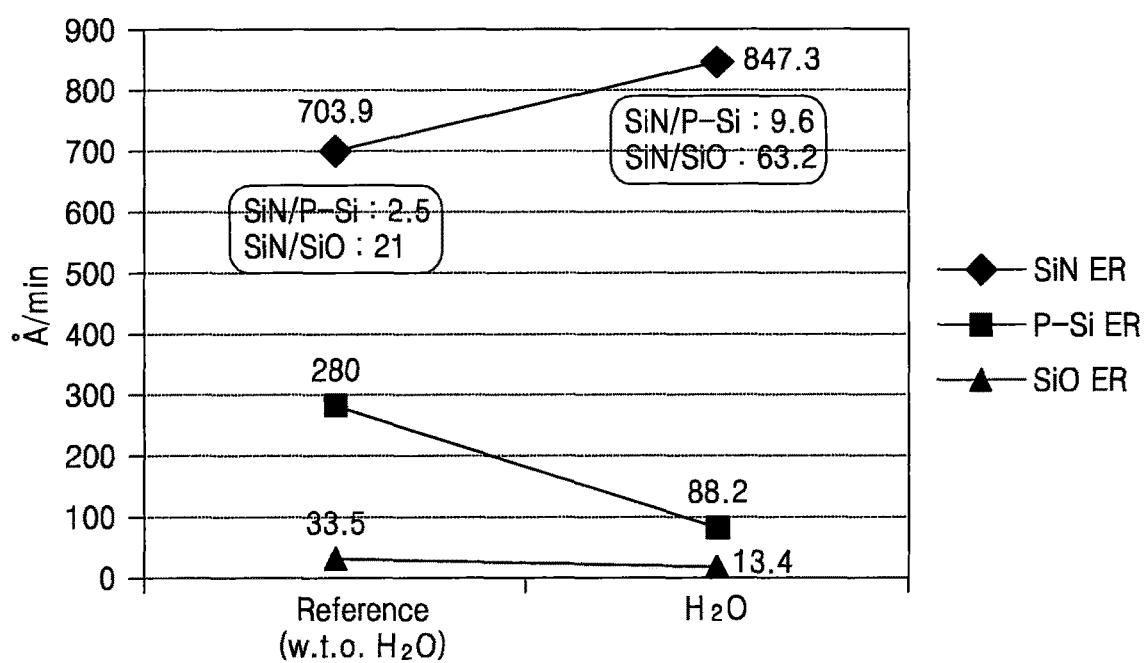
FIGS. 6 and 7 are graphs showing comparisons of an etch rate with a selectivity between a case in which water is supplied and a case in which water is not supplied in the etching method of FIG. 4.
Figure 7:
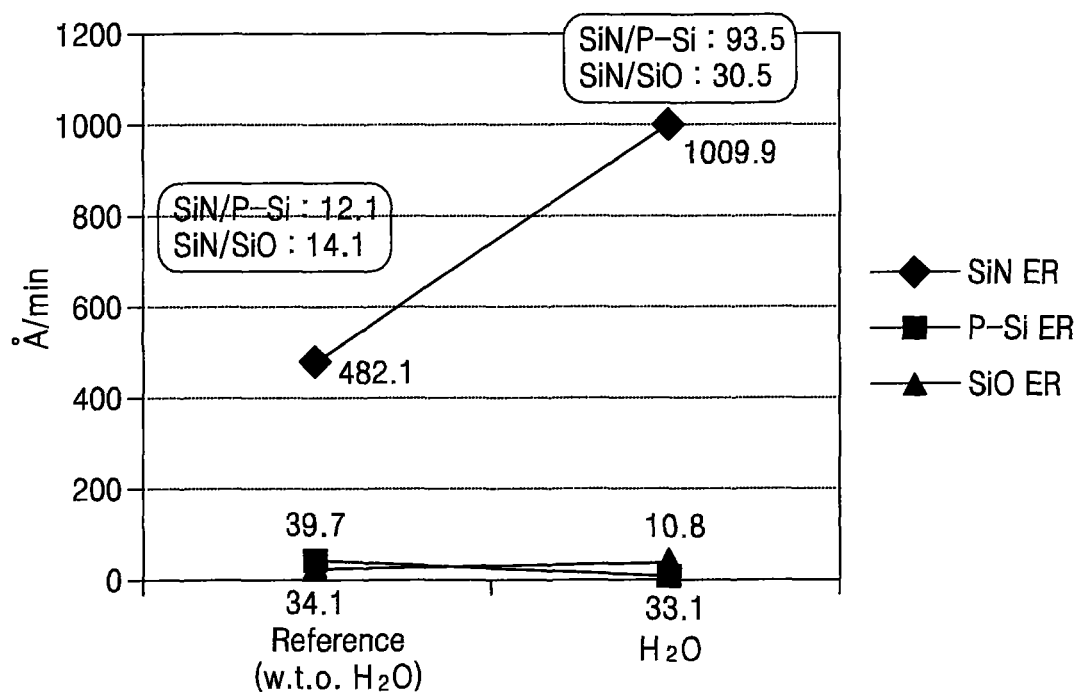

FIGS. 6 and 7 are graphs showing comparisons of an etch rate and a selectivity between a case in which water is supplied and a case in which water is not supplied, in the etching method using plasma of FIG. 4. FIG. 6 is a graph showing a case in which water is supplied through the third path "3. $H_2O$" or the fourth path "4. $H_2O$" of FIG. 5. FIG. 7 is a graph showing a case in which water is supplied through the seventh path "7. $H_2O$" of FIG. 5. In FIGS. 6 and 7, the x-axis simply denotes a positional difference between a case in which water does not exist (Reference (w.t.o. $H_2O$)) and a case in which water exists ($H_2O$), and the y-axis denotes an etch rate (Å/min).

Referring to FIG. 6, first, in a case in which water does not exist (Reference (w.t.o. $H_2O$)), the silicon nitride film has an etch rate of about 703.9, the polysilicon film has an etch rate of about 280, and the silicon oxide film has an etch rate of about 33.5. For reference, in the graph, $Si_3N_4$ is indicated as SiN and $SiO_2$ is indicated as SiO for convenience of explanation, and ER is an abbreviation of an etch rate. Next, in the case in which water exists ($H_2O$), the silicon nitride film has an etch rate of about 847.3, the polysilicon film has an etch rate of about 88.2, and the silicon oxide film has an etch rate of about 13.4. Accordingly, it may be seen that, as water is supplied, the etch rate of the silicon nitride film may increase and the etch rates of the polysilicon film and the silicon oxide film may decrease.

Accordingly, it may be seen that a selectivity of the silicon nitride film to the polysilicon film (SiN/p-Si) increases almost 4 times from 2.5 when water does not exist to 9.6 when water exists. Also, it may seen that a selectivity of the silicon nitride film to the silicon oxide film (SiN/SiO) increases almost 3 times from 21 when water does not exist to 63.2 when water exists.

As a result, in the etching method using plasma according to the present exemplary embodiment, since the etching object, for example, the silicon nitride film, is etched by supplying water with plasma, etching may be performed at a relatively high etch rate. Also, since the selectivity of the silicon nitride film is high with respect to the polysilicon film and the silicon oxide film, only the silicon nitride film may be stably and easily etched.

Referring to FIG. 7, first, in a case in which water does not exist (Reference (w.t.o. $H_2O$)), the silicon nitride film has an etch rate of about 482.1, the polysilicon film has an etch rate of about 39.7, and the silicon oxide film has an etch rate of about 34.1. Next, in the case in which water exists ($H_2O$), the silicon nitride film has an etch rate of about 1009.9, the polysilicon film has an etch rate of about 10.8, and the silicon oxide film has an etch rate of about 33.1. Accordingly, similar to FIG. 6, it may be seen that, as water is supplied, the etch rate of the silicon nitride film may increase and the etch rates of the polysilicon film and the silicon oxide film may decrease or may be almost the same.

Accordingly, it may be seen that the selectivity of the silicon nitride film to the polysilicon film (SiN/p-Si) increases almost 8 times from 12.1 when water does not exist to 93.5 when water exists. Also, it may seen that a selectivity of the silicon nitride film to the silicon oxide film (SiN/SiO) increases more than twice from 14.1 when water does not exist to 30.5 when water exists.

Thus, similar to FIG. 6, since the etching object, for example, the silicon nitride film, is etched by supplying water with plasma, etching may be performed at a relatively high etch rate. Also, since the selectivity of the silicon nitride film is high with respect to the polysilicon film and the silicon oxide film, only the silicon nitride film may be stably and easily etched.

Also, as water is supplied through the seventh path "7. $H_2O$," that is, water is directly supplied in the form of vapor through the entrance directly connected to the process chamber 110, the etch rate of the silicon nitride film may increase over twice. Also, the selectivity of the silicon nitride film to the polysilicon film may be increased nearly 8 times. Accordingly, when the polysilicon film and the silicon nitride film are included together and only the silicon nitride film is the one that is to be selectively and rapidly etched, the method of supplying water through the seventh path "7. $H_2O$" may be efficient, compared to the methods of supplying water through the other paths.

Figure 8A:
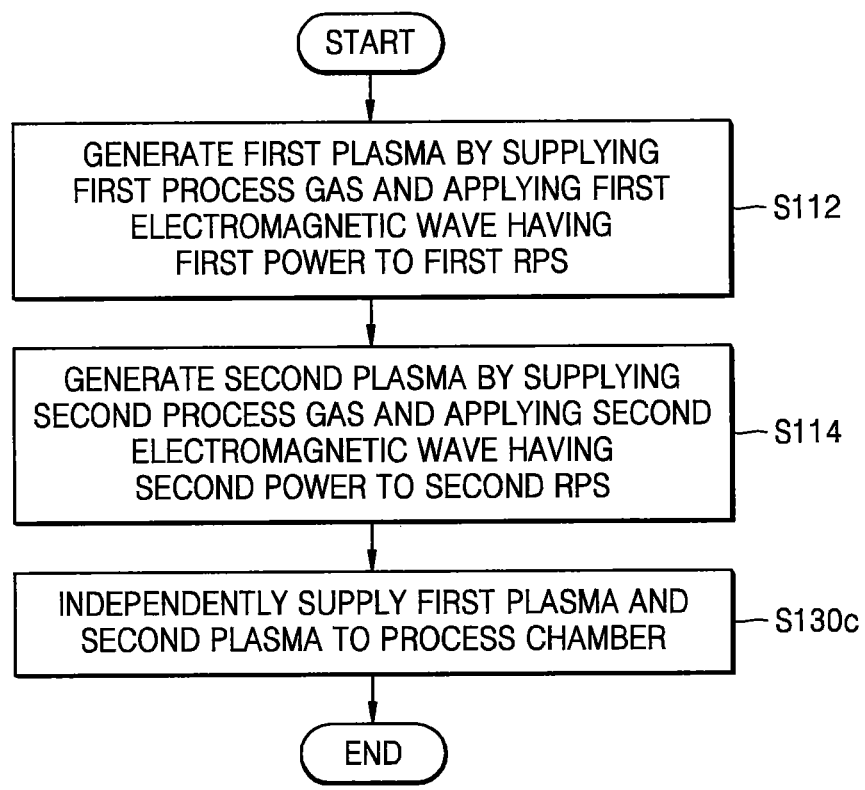
FIGS. 8A and 8B are, respectively, a flowchart illustrating a method of generating and supplying plasma in a semiconductor device fabrication apparatus having two RPS's and a waveform diagram of an electromagnetic wave applied corresponding thereto.
Figure 8B:
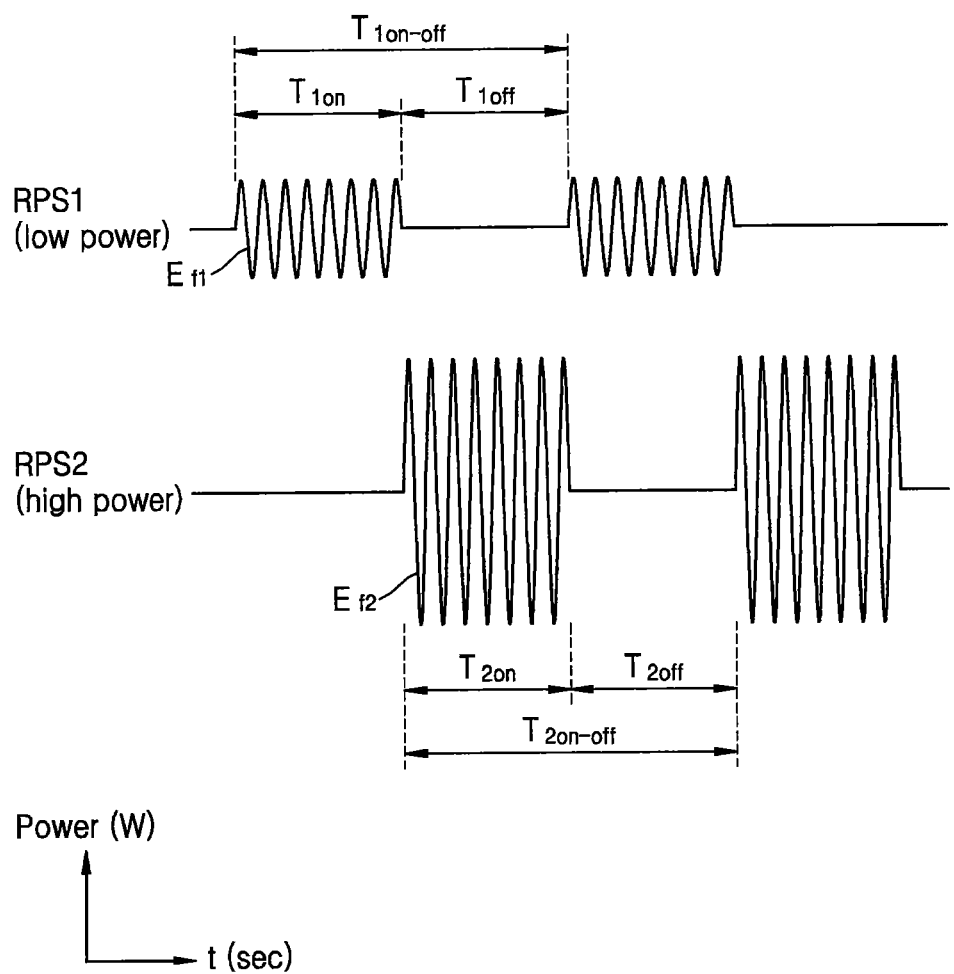

FIGS. 8A and 8B are, respectively, a flowchart illustrating a method of generating and supplying plasma in a semiconductor device fabrication apparatus having two RPS's and a waveform diagram of an electromagnetic wave applied corresponding thereto.

Referring to FIGS. 8A and 8B, in the method of generating and supplying plasma according to the present exemplary embodiment, first, the first process gas is supplied to the first RPS, and a first electromagnetic wave $E_{f1}$ having a first power is applied to the first RPS at a first duty ratio, thereby generating the first plasma (S112). The first process gas may include, for example, an F-based gas. The first power may be a low power that is less than several hundreds of watts. The duty ratio may be defined to be a percentage of an on-period to a cycle when an electromagnetic wave is cyclically applied being turned on and off. For example, when a power-on period $T_{1on}$ of the first electromagnetic wave $E_{f1}$ is about 10 seconds and a power-off period $T_{1off}$ is about 10 seconds, an on-off cycle $T_{1on-off}$ may be about 20 seconds and a first duty ratio may be $T_{1on}/T_{1on-off}*100(\%)=50\%$. When the duty ratio is 100%, it may mean that an electromagnetic wave is continuously applied without a power-off period. Accordingly, the first electromagnetic wave may be applied to the first RPS according to the first duty ratio in various methods.

Next, the second process gas is supplied to the second RPS, a second electromagnetic wave $E_{f2}$ having the second power is applied at a second duty ratio, thereby generating the second plasma (S114). The second process gas may include, for example, an O-based gas. The second power may be a high power of several hundred watts or higher. The second duty ratio may be presented by $T_{2on}/T_{2on-off}*100(\%)$. The second duty ratio may be identical to or different from the first duty ratio. In the present exemplary embodiment, as illustrated in FIGS. 8A and 8B, the second duty ratio may be identical to the first duty ratio, but the power-on period of the second duty ratio may be arranged to alternate with the power-on period of the first duty ratio.

In the plasma generation method according to the present exemplary embodiment, although the first plasma is generated and then the second plasma is generated, this is merely an example. For example, the second plasma may be first generated and then the first plasma may be generated. Also, the first and second pieces of plasma may be simultaneously generated.

As illustrated in FIG. 8B, the first electromagnetic wave $E_{f1}$ and the second electromagnetic wave $E_{f2}$ may be applied in the form of a continuous wave CW. However, the first electromagnetic wave $E_{f1}$ and the second electromagnetic wave $E_{f2}$ may be applied by being pulsed or in a combined form of the CW form and the pulsed form. The pulsation may mean turning power on/off many times at a pulse frequency in the on-period. For example, when the frequency of an electromagnetic wave is about 100 MHz and a pulse frequency is about 500 kHz, an electromagnetic wave corresponding to 100M/500 k=200 cycles may be included in one pulse cycle. Also, the on-period and the off-period are included in one pulse cycle. When the length of the on-period is the same as the off-period in one pulse, an electromagnetic wave corresponding to 100 cycles may be included in the on-period of the pulse.

Next, the generated first and second plasmas are independently supplied to the process chamber (see 110 of FIG. 5) (S130c). For example, the first plasma may be supplied to the process chamber through the first shower head (see 152 of FIG. 5), and the second plasma may be supplied to the process chamber through the second shower head (see 154 of FIG. 5). The supply of the first and second plasmas to the process chamber may mean etching the etching object (see 300 of FIG. 5) placed on the stage (see 120 of FIG. 5). Alternatively, although not shown in the flowchart of FIG. 8A, water may be supplied to the process chamber with the first and second plasmas. The water may be supplied to the process chamber in the pretreatment method described above with reference to FIGS. 2 to 3B, or via various paths in the form of vapor as described above with reference to FIGS. 4 and 5.

The first and second pieces of plasma may be sequentially supplied to the process chamber. For example, the first plasma may be first supplied and then the second plasma may be supplied. In some cases, the supply order may be changed. Also, the first and second plasmas may be simultaneously supplied. Alternatively, the supply of the first plasma may mean supply of radicals included in the first plasma, not the supply of the all components of the first plasma. In other words, ions, electrons, etc. of the first plasma may be blocked when the first plasma passes through the first holes (see 152H of FIG. 5), and only the first radicals may be supplied to the process chamber. The supply of the second plasma may be understood to be the same as the supply of the first plasma.

In addition, when the etching object needs to be anisotropically etched, ions may be necessary. In this case, the ions may be generated in the radicals in the process chamber by applying a bias to the radicals. Accordingly, the etching object may be anisotropically etched using the generated ions.

Figure 9A:
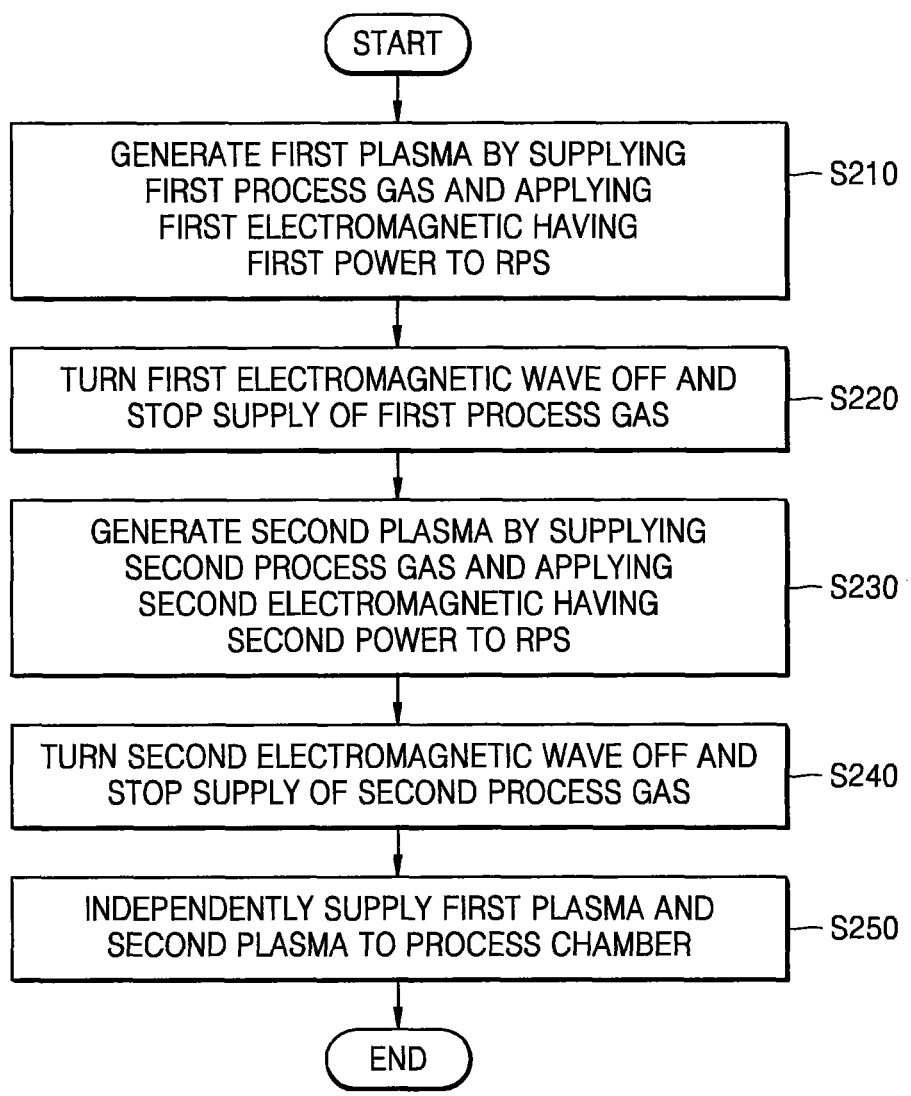
FIGS. 9A and 9B are, respectively, a flowchart illustrating a method of generating and supplying plasma in a semiconductor device fabrication apparatus having one RPS and a waveform diagram of an electromagnetic wave applied corresponding thereto.
Figure 9B:
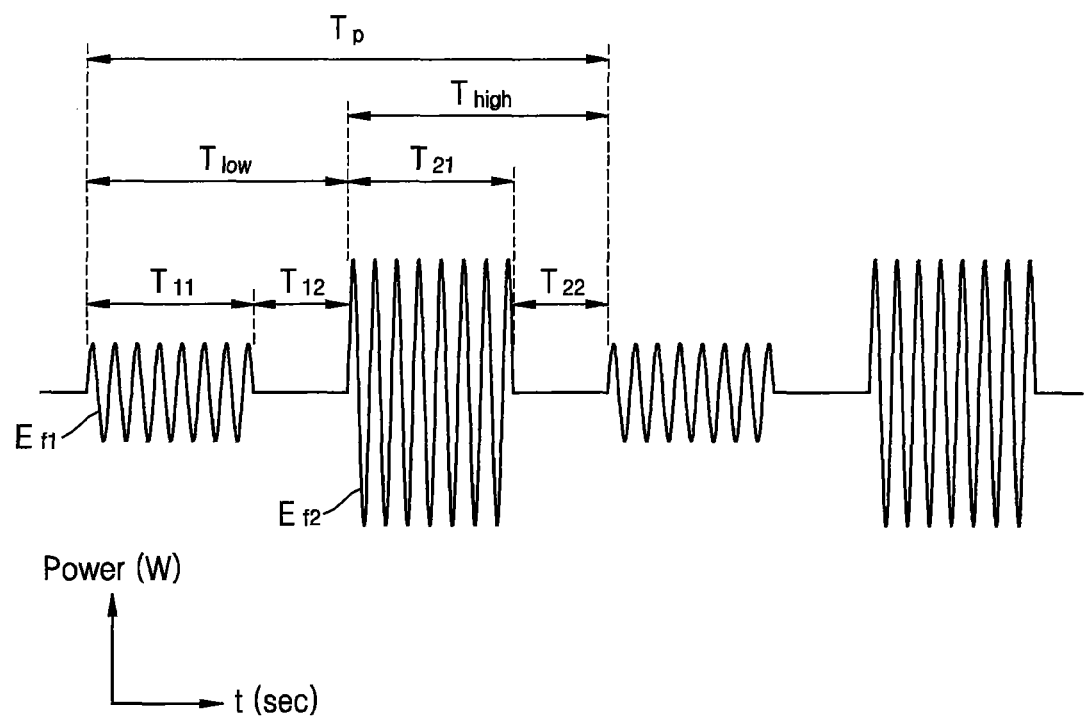

FIGS. 9A and 9B are, respectively, a flowchart illustrating a method of generating and supplying plasma in a semiconductor device fabrication apparatus having one RPS and a waveform diagram of an electromagnetic wave applied corresponding thereto.

Referring to FIGS. 9A and 9B, in the method of generating and supplying plasma according to the present exemplary embodiment, first, the first process gas is supplied to the RPS, and the first plasma is generated by applying the first electromagnetic wave $E_{f1}$ having the first power (S210) to the RPS. The period where the first electromagnetic wave $E_{f1}$ is applied may correspond to the first low-power period $T_{11}$. Since only one RPS is in use, the RPS may be any one of the first RPS 132 and the second RPS 134 of the semiconductor device fabrication apparatus 100 of FIG. 5. The first process gas and the first power are the same as those described with reference to FIGS. 8A and 8B.

In the method of generating plasma according to the present exemplary embodiment, when the first electromagnetic wave $E_{f1}$ is repeated for the same power application period, the duty ratio of the first electromagnetic wave $E_{f1}$ may be defined. For example, as illustrated in FIG. 9B, when a low-power period $T_{low}$ and a high-power period $T_{high}$ are the same and repeated at a power application cycle $T_p$, the duty ratio of the first electromagnetic wave $E_{f1}$ may be presented by $T_{11}/T_{low}*100(\%)$.

Next, the first electromagnetic wave $E_{f1}$ is turned off and the supply of the first process gas is stopped (S220). The stopping of the supply of the first process gas (S220) may correspond to the second low-power period $T_{12}$ and may perform a function of gas stabilization. Alternatively, in the stopping of the supply of the first process gas (S220), the second process gas may be supplied to generate the second plasma in the future.

Then, the second process gas is supplied to the RPS, and the second plasma is generated by applying the second electromagnetic wave $E_{f2}$ having the second power (S230) to the RPS. The period where the second electromagnetic wave $E_{f2}$ is applied to the RPS may correspond to the first high-power period $T_{21}$. The second process gas and the second power are the same as those described with reference to FIGS. 8A and 8B. When the low-power period $T_{low}$ of the first electromagnetic wave $E_{f1}$ and the high-power period $T_{high}$ of the second electromagnetic wave $E_{f2}$ are the same and repeated at the power application cycle $T_p$, the duty ratio of the second electromagnetic wave $E_{f2}$ may be defined. For example, in FIG. 9B, the duty ratio of the second electromagnetic wave $E_{f2}$ may be presented by $T_{21}/T_{high}*100(\%)$.

Next, the second electromagnetic wave $E_{f2}$ is turned off and the supply of the second process gas is stopped (S240). The stopping of the supply of the second process gas (S240) may correspond to the second high-power period $T_{22}$ and may perform a function of gas stabilization. Alternatively, in the stopping of the supply of the second process gas (S240), the first process gas may be supplied for the generation of the first plasma in the future.

Alternatively, the first electromagnetic wave $E_{f1}$ and the second electromagnetic wave $E_{f2}$ may be applied in the form of a continuous wave CW, as illustrated in FIG. 9B. However, the first electromagnetic wave $E_{f1}$ and the second electromagnetic wave $E_{f2}$ may be applied by being pulsed or in a combined form of the CW form and the pulsed form.

Next, the generated first and second plasmas are independently supplied to the process chamber 110 (S250). The supply of the first and second plasmas to the process chamber is the same as that described above with reference to FIGS. 8A and 8B. However, in the present exemplary embodiment, since only one RPS is provided, only one shower head may exist. As the generated first and second plasmas are supplied to the shower head according to a time sequence, the first and second plasmas may be independently supplied to the process chamber. In some cases, two shower heads exist and thus the first plasma is supplied to the first shower head and the second plasma is supplied to the second shower head. Thus, the first and second plasmas may be independently supplied to the process chamber through the first and second shower heads.

Although not illustrated in the flowchart of FIG. 9A, water may be supplied to the process chamber with the first and second plasmas. The water may be supplied to the process chamber by the pretreatment method described with reference to FIGS. 2 to 3B. Also, as described with reference to FIGS. 4 and 5, the water may be supplied in the form of vapor to the process chamber through various paths.

Figure 10:
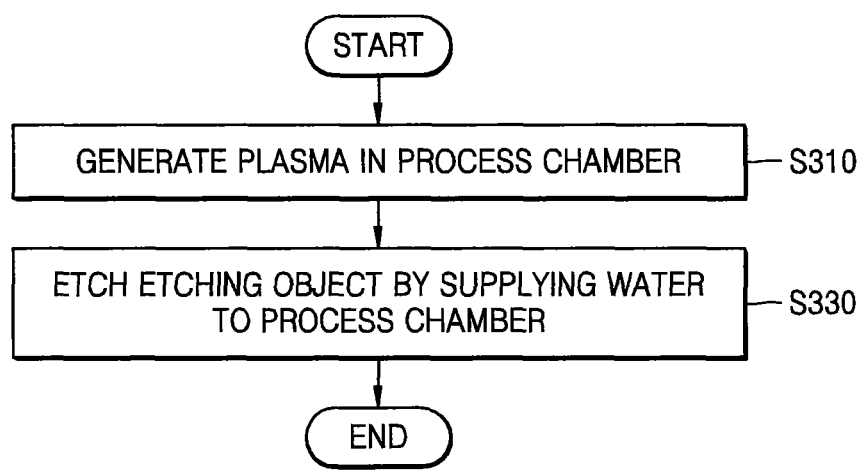
FIG. 10 is a flowchart illustrating an etching method using plasma, according to an exemplary embodiment.

FIG. 10 is a flowchart illustrating an etching method using plasma, according to an exemplary embodiment.

Referring to FIG. 10, in the etching method using plasma according to the present exemplary embodiment, first, plasma is generated in the process chamber (S310). In the etching method using plasma according to the present exemplary embodiment, plasma may be directly in the process chamber by supplying the process gas to the process chamber and applying power to the process chamber without using the RPS. For example, plasma may be directly generated in the process chamber by using the direct plasma technology such as CCP or ICP.

Next, the etching object is etched by supplying water to the process chamber (S330). The water may be supplied by the pretreatment method performed on the etching object or by the method of supplying water to the process chamber in the form of vapor. The pretreatment method performed on the etching object may be performed by keeping the etching object with water in a sealed container or by spraying steam toward the etching object as described above with reference to FIGS. 2 to 3B. Then, the arrangement of the pretreated etching object in the process chamber may correspond to the supply of water to the process chamber.

Alternatively, the method of supplying water to the process chamber in the form of vapor is a method of supplying water directly to the process chamber through various paths, which is described in detail with reference to FIG. 11. In addition, since plasma is already present in the process chamber or plasma is generated in the process chamber, there is no need to separately supply plasma.

According to the etching method using plasma according to the present exemplary embodiment, even if the direct plasma technology does not use the RPS, by supplying water to the process chamber and etching the etching object using plasma, the etching efficiency with respect to the etching object, for example, an etch rate and a selectivity of the etching object, may be increased.

Figure 11:
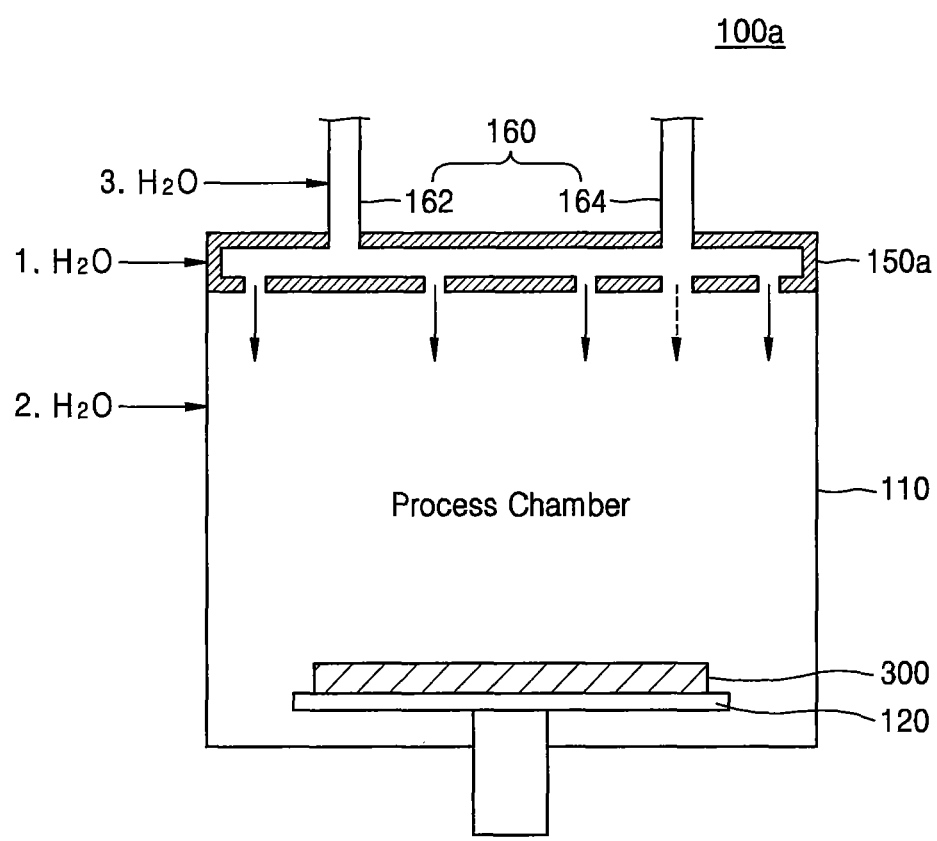
FIG. 11 is a schematic diagram of a structure of a semiconductor device fabrication apparatus to show a concept of supplying water to a process chamber in the etching method of FIG. 10.

FIG. 11 is a schematic diagram illustrating a structure of a semiconductor device fabrication apparatus 100a to show a concept of supplying water to the process chamber in the etching method using plasma of FIG. 10.

Referring to FIG. 11, in the etching method using plasma according to the present exemplary embodiment, the semiconductor device fabrication apparatus 100a that does not include an RPS may be used. The semiconductor device fabrication apparatus 100a may include the process chamber 110, the stage 120, and a shower head portion 150a. The process chamber 110 and the stage 120 are the same as those described with reference to FIG. 5.

The shower head portion 150a may include only one shower head. At least one process gas supply path 160 may be connected to the shower head portion 150a. In the present exemplary embodiment, the process gas supply path 160 may include two supply paths, for example, first and second supply paths 162 and 164. For example, of the process gas supply path 160, the first process gas may be supplied through the first supply path 162 and the second process gas may be supplied through the second supply path 164. The same process gas may be supplied through both of the first supply path 162 and the second supply path 164. Also, as illustrated in FIG. 5, the shower head portion 150a may include two shower heads, and the first supply path 162 is connected to the first shower head and the second supply path 164 is connected to the second shower head. Accordingly, the first process gas may be supplied through the first shower head and the second process gas may be supplied through the second shower head.

The water may be supplied to the process chamber 110 in the form of vapor through various paths. For example, in the first path indicated by "1. $H_2O$," water may be supplied to the shower head portion 150a. In the second path indicated by "2. $H_2O$," water may be supplied directly to the process chamber 110 through the entrance connected to the process chamber 110. In the third path indicated by "3. $H_2O$," water may be supplied to the shower head portion 150a with the process gases through the process gas supply path 160. For reference, the first and third paths are similar to each other in that water is supplied to the shower head portion 150a. However, the first path may be different than the third path in that, while in the case of the first path water is supplied to the shower head portion 150a through a path that is different from the path for the process gases, in the case of the third path, water is supplied to the shower head portion 150a through the same path as the path for the process gases.

Alternatively, in the etching method using plasma according to the present exemplary embodiment, water may be supplied to the process chamber 110 through any one of the above-described three paths or through two or more paths.

Figure 12:
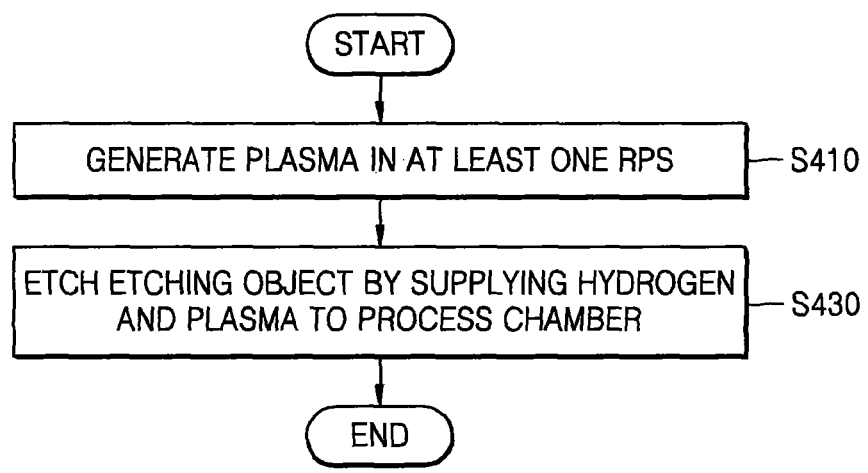
FIG. 12 is a flowchart illustrating an etching method using plasma, according to an exemplary embodiment.

FIG. 12 is a flowchart illustrating an etching method using plasma, according to an exemplary embodiment. For convenience of explanation, the descriptions provided above with reference to FIG. 1 are briefly provided or omitted.

Referring to FIG. 12, in the etching method using plasma according to the present exemplary embodiment, first, plasma is generated in at least one RPS (S410). The generation of plasma in at least one RPS is the same as that described with reference to FIG. 1.

Next, the etching object is etched by supplying hydrogen $H_2$ and plasma to the process chamber (see 110 of FIG. 14) (S430). The etching method using plasma according to the present exemplary embodiment may be different from the etching method using plasma of FIG. 1 in that hydrogen is supplied instead of water to the process chamber with plasma. The hydrogen may be supplied to the process chamber through various paths, which is described in detail with reference to FIGS. 13 and 14.

In the etching method using plasma according to the present exemplary embodiment, since the etching object is etched by supplying hydrogen to the process chamber with plasma, an etch efficiency with respect to the etching object may be improved. For example, an etch rate and a selectivity of the etching object may be increased. In particular, when an F-based process gas is in use, as hydrogen is supplied to the process chamber with plasma, an etch rate and a selectivity of the etching object may be increased. The effect or principle of etching the etching object by supplying hydrogen with plasma is described below in detail with reference to FIGS. 15A to 18.

In the etching method using plasma according to the present exemplary embodiment, since the etching object is etched by generating plasma in at least one RPS and supplying hydrogen to the process chamber with plasma, the etching efficiency with respect to the etching object, for example, an etch rate and a selectivity of the etching object, may be increased.

Figure 13:
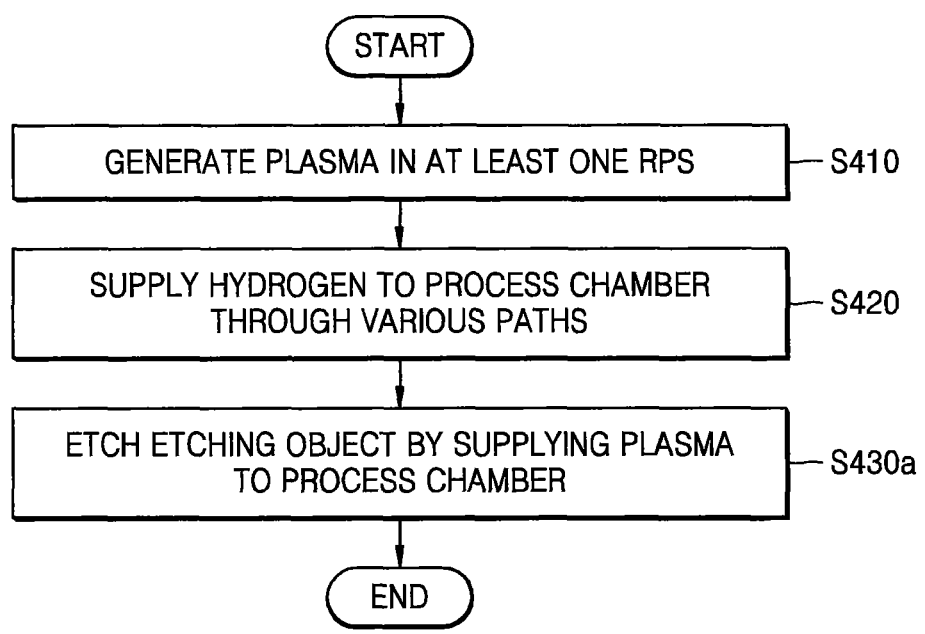
FIG. 13 is a flowchart illustrating in detail the etching method of FIG. 12.

FIG. 13 is a flowchart illustrating in detail the etching method using plasma of FIG. 12.

Referring to FIG. 13, in the etching method using plasma according to the present exemplary embodiment, first, plasma is generated in at least one RPS (S410). The generation of plasma in at least one RPS is the same as that described with reference to FIG. 1.

Next, hydrogen is supplied to the process chamber through various paths (S420). For example, hydrogen may be supplied to at least one RPS during the etching process using plasma. Also, hydrogen may be supplied to a plasma supply path between the at least one RPS and the shower head, or to the shower head. The hydrogen supplied to the at least one RPS, the plasma supply path, or the shower head is finally supplied to the process chamber. Alternatively, in addition to the above methods, hydrogen may be directly supplied to the process chamber through the entrance directly connected to the process chamber.

Additionally, although FIG. 13 illustrates that hydrogen is supplied to the process chamber after plasma is generated, the hydrogen may be supplied before or in the middle of the generation of plasma. The method of supplying hydrogen to the process chamber during the etching process using plasma is described in detail with reference to FIG. 14, by using the semiconductor device fabrication apparatus.

After the supply of hydrogen to the process chamber (S420), the etching object is etched by supplying plasma to the process chamber (S430a). Alternatively, the plasma may be supplied with hydrogen or separately from hydrogen. For example, in the supply of hydrogen to the process chamber (S420), when the hydrogen is supplied to the at least one RPS, the plasma supply path, or the shower head, the plasma may be supplied to the process chamber with hydrogen. However, when hydrogen is supplied through the entrance directly connected to the process chamber, plasma may be supplied to the process chamber separately from the hydrogen.

Alternatively, as described above regarding the sequence between the generation of plasma and the supply of hydrogen, hydrogen may be supplied before, in the middle of, or after the generation of plasma. Accordingly, the supply of hydrogen may be performed before the supply of plasma to the process chamber, simultaneously with the supply of plasma to the process chamber, or after the supply of plasma to the process chamber. Also, the supply of hydrogen may continue with the supply of plasma during the etching process or may continue for a predetermined time only and then may be stopped. Furthermore, hydrogen may be intermittently supplied during the etching process.

In the etching method using plasma according to the present exemplary embodiment, since the etching object is etched by generating plasma in at least one RPS and supplying hydrogen to the process chamber with plasma through various paths, the etching efficiency with respect to the etching object, for example, an etch rate and a selectivity of the etching object, may be increased.

Figure 14:
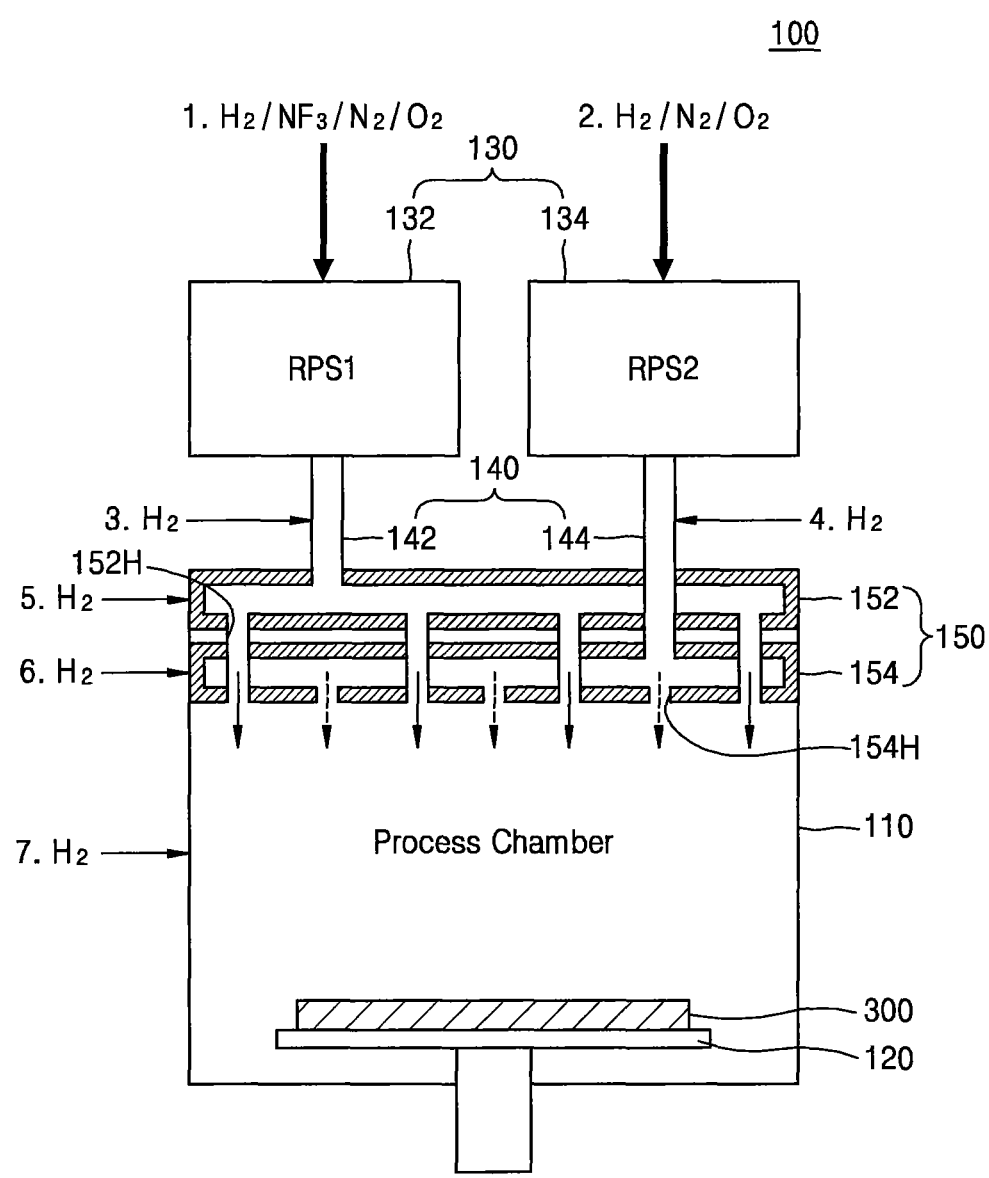
FIG. 14 is a schematic diagram illustrating a structure of a semiconductor device fabrication apparatus having an RPS to show a concept of supplying hydrogen to a process chamber in the etching method of FIG. 13.

FIG. 14 is a schematic diagram illustrating a structure of a semiconductor device fabrication apparatus 100 having an RPS to show a concept of supplying hydrogen to a process chamber in the etching method using plasma of FIG. 13. For convenience of explanation, the descriptions provided above with reference to FIG. 5 are briefly provided or omitted.

Referring to FIG. 14, in the etching method using plasma according to the present exemplary embodiment, the semiconductor device fabrication apparatus 100 having two RPS's may be used. The semiconductor device fabrication apparatus 100 may include the process chamber 110, the stage 120, the RPS portion 130, and the shower head portion 150, as described with reference to FIG. 5. Since the process chamber 110, the stage 120, the RPS portion 130, the shower head portion 150, and the etching object 300 are already described with reference to FIG. 5, detailed descriptions thereof are omitted. Also, since the first and second process conditions, the first electromagnetic wave of the first power, and the second electromagnetic wave of the second power, the first and second process gases used in the first RPS 132 and the second RPS 134, and the first and second plasma respectively generated from the first RPS 132 and the second RPS 134 are already described with reference to FIG. 5, detailed descriptions thereof are omitted.

In the etching method using plasma according to the present exemplary embodiment, hydrogen may be supplied to the process chamber 110 through various paths. For example, in the first path indicated by "1. $H_2/NF_3/N_2/O_2$," hydrogen may be supplied to the first RPS 132 with $NF_3$, $N_2$, $O_2$, etc. that are the first process gas. In the second path indicated by "2. $H_2/N_2/O_2$," hydrogen may be supplied to the second RPS 134 with $N_2$, $O_2$, etc. that are the second process gas. In the third path indicated by "3. $H_2$," hydrogen may be supplied to the first supply path 142 with the first plasma generated in the first RPS 132. In the fourth path indicated by "4. $H_2$," hydrogen may be supplied to the second supply path 144 with the second plasma generated in the second RPS 134. In the fifth path indicated by "5. $H_2$," hydrogen may be supplied to the first shower head 152 with the first plasma from the first RPS 132. In the sixth path indicated by "6. $H_2$," hydrogen may be supplied to the second shower head 154 with the second plasma generated in the second RPS 134. In the seventh path indicated by "7. $H_2$," hydrogen may be supplied directly to the process chamber 110 through the entrance directly connected to the process chamber 110.

Alternatively, in the etching method using plasma according to the present exemplary embodiment, water may be supplied to the process chamber 110 through any one of the above-described seven paths or through two or more paths of the seven paths.

According to the etching method using plasma according to the present exemplary embodiment, as described above with reference to FIG. 5, since the first and second plasma are independently generated by using two RPS's arranged to be spaced apart from the process chamber 110 and are supplied to the process chamber 110, the quantity and type of plasma may be independently and precisely controlled in the semiconductor device fabrication process such as deposition, etching, cleaning, etc. Accordingly, the etching of the etching object 300 may be uniformly and precisely controlled in the semiconductor device fabrication process, for example, an etching process.

Also, in the etching method using plasma according to the present exemplary embodiment, since plasma is generated in at least one RPS and the generated plasma is provided to the process chamber, and also, hydrogen is supplied to the process chamber through various paths, the etching efficiency with respect to the etching object, for example, an etch rate and a selectivity of the etching object, may be increased.

Figure 15A:
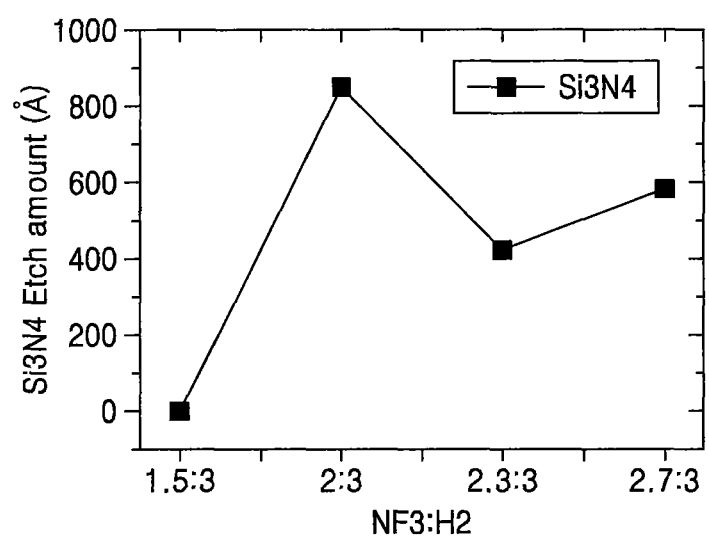
FIGS. 15A and 15B are graphs showing comparisons of selectivity according to a flow rate ratio of nitrogen trifluoride ($NF_3$) and hydrogen ($H_2$) in the etching method of FIG. 14.
Figure 15B:
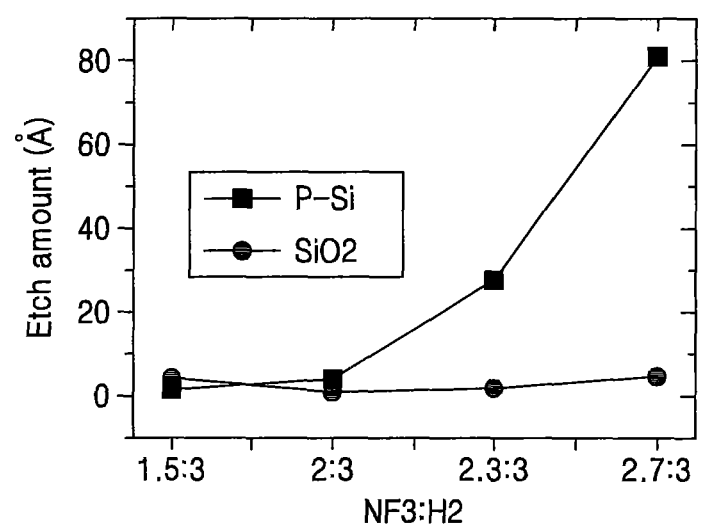

FIGS. 15A and 15B are graphs showing comparisons of selectivity according to a flow rate ratio of nitrogen trifluoride ($NF_3$) and hydrogen ($H_2$) in the etching method using plasma of FIG. 14. In the graphs of FIGS. 15A and 15B, the x-axis denotes a flow rate ratio between $NF_3$ and $H_2$, and the y-axis denotes an etching quantity or etching thickness of a film in units of angstroms Å. The etching quantity may correspond to an etching quantity per minute. In this case, the etching quantity may be considered to be the same concept of the etch rate. Alternatively, $NF_3$ is assumed to be in a 100% dissociated state.

As it may be seen from the graph of FIG. 15A, when a flow rate ratio between $NF_3$ and $H_2$ is 2:3, the etching quantity of the silicon nitride film is the maximum at over 800 Å. When the flow rate ratio is less than or greater than 2:3, it may be seen that the etching quantity of the silicon nitride film decreases. Accordingly, it may be seen that the etching quantity of the silicon nitride film is maximized by supplying a flow rate of $H_2$ such that the ratio between $[NF_3]*D$ and $[H_2]$ is 2:3 in the etching method using plasma. The above relationship may be expressed by Equation 1.

$$[NF_3]*D:[H_2]=2:3, \quad\quad\quad [\text{Equation 1}]$$

In Equation 1, "$[NF_3]$" denotes the flow rate of $NF_3$. "$[H_2]$" denotes the flow rate of $H_2$. "D" denotes a degree of dissociation of $NF_3$. Alternatively, a flow rate of gas may be presented in units of standard cubic centimeter per minute (sccm).

In detail, when $NF_3$ is dissociated by 100% and $NF_3$ of 200 sccm and $H_2$ of 300 sccm are supplied to the process chamber, the etching quantity of the silicon nitride film may be maximized. If $NF_3$ is dissociated by 50% and $NF_3$ of 400 sccm and $H_2$ of 300 sccm are supplied to a process chamber, the etching quantity of the silicon nitride film may be maximized. Alternatively, as the flow rate ratio is 2:3 by adjusting the flow rate of $NF_3$ with the flow rate of $H_2$ being fixed, the silicon nitride film may have a high etch rate and a high selectivity. In contrast, the same result may be obtained by fixing the flow rate of $NF_3$ and adjusting the flow rate of $H_2$.

As it may be seen from the graph of FIG. 15B, the etching quantity of the polysilicon film may be maintained in an almost minimum state until the flow rate ratio between $NF_3$ and $H_2$ reaches 2:3. In other words, when the flow rate ratio between $NF_3$ and $H_2$ exceeds 2:3, it may be seen that the etching quantity of the polysilicon film greatly increases. Accordingly, when both of the polysilicon film and the silicon nitride film are etched together, the flow rate ratio between $NF_3$ and $H_2$ exceeds 2:3, the selectivity may be deteriorated.

Also, the silicon oxide film may have almost the same etching quantity regardless of the flow rate ratio between $NF_3$ and $H_2$. Strictly speaking, when the flow rate ratio between $NF_3$ and $H_2$ is 2:3, the silicon oxide film has a minimum etching quantity. Thus, when the silicon oxide film and the silicon nitride film are etched together, the flow rate ratio between $NF_3$ and $H_2$ may be maintained at 2:3.

As a result, if at least one of the silicon oxide film and the polysilicon film, and the silicon nitride film are included altogether and only the silicon nitride film is the one that is to be selectively and easily etched, $H_2$ may be supplied to the process chamber such that the flow rate ratio between $NF_3$ and $H_2$ is 2:3. The flow rate of $NF_3$ may mean a flow rate by taking into account a degree of dissociation of $NF_3$.

Figure 16A:
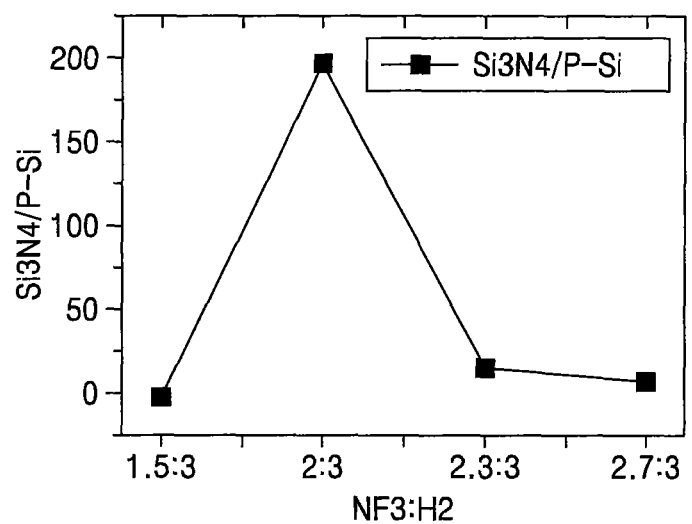
FIGS. 16A and 16B are graphs showing comparisons of selectivity according to a flow rate ratio of $NF_3$ and $H_2$ in the etching method of FIG. 14.
Figure 16B:
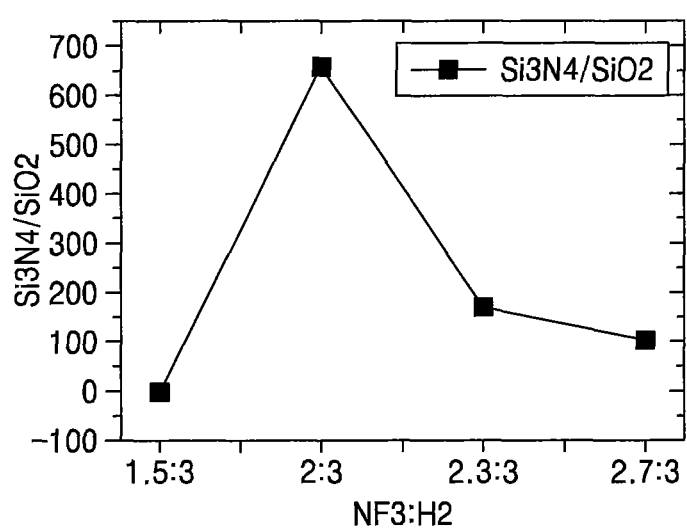

FIGS. 16A and 16B are graphs showing comparisons of selectivity according to a flow rate ratio of $NF_3$ and $H_2$ in the etching method using plasma of FIG. 14. In the graphs of FIGS. 16A and 16B, the x-axis denotes a flow rate ratio between $NF_3$ and $H_2$, and the y-axis denotes selectivity. Alternatively, $NF_3$ is assumed to be in a 100% dissociated state.

As it may be seen from the graph of FIG. 16A, when a flow rate ratio between $NF_3$ and $H_2$ is 2:3, the selectivity of the silicon nitride film to the polysilicon film ($Si_3N_4$/P—Si) may be the maximum at about 200. When the flow rate ratio is less than or greater than 2:3, it may be seen that the selectivity of the silicon nitride film to the polysilicon film may decrease. Accordingly, the above result may be anticipated by the etching quantity of the polysilicon film and the silicon nitride film according to the flow rate ratio between $NF_3$ and $H_2$ of FIGS. 15A and 15B.

Referring to FIG. 16B, when the flow rate ratio between $NF_3$ and $H_2$ is 2:3, the selectivity of the silicon nitride film to the silicon oxide film ($Si_3N_4$/$SiO_2$) is over 650 at its maximum. When the flow rate ratio is less or greater than 2:3, the selectivity of the silicon nitride film to silicon oxide film may decrease. The result may be anticipated by the etching quantity of the silicon oxide film and the silicon nitride film according to the flow rate ratio between $NF_3$ and $H_2$ of FIGS. 15A and 15B.

All the results of FIGS. 15A to 16B may be as shown by Table 1 below.

TABLE 1

| $NF_3$:$H_2$ | Etching Quantity (Å) | | | Selectivity | |
| --- | --- | --- | --- | --- | --- |
| | $Si_3N_4$ | P—Si | $SiO_2$ | $Si_3N_4$/P—Si | $Si_3N_4$/$SiO_2$ |
| 1.5:3 | 1 | 2 | 4 | 0.4 | 0.2 |
| 2.0:3 | 857 | 4 | 1 | 196.6 | 661.6 |
| 2.3:3 | 412 | 28 | 2 | 15.0 | 170.9 |
| 2.7:3 | 581 | 81 | 5 | 7.1 | 106.6 |

As indicated by the bold font, when the flow rate ratio of $NF_3$ and $H_2$ is 2:3, the etching quantity of the silicon nitride film may be the maximum, the etching quantity of the silicon oxide film may be the minimum, and the etching quantity of the polysilicon film may be maintained at a very small quantity. Also, it may be seen that the selectivity of the silicon nitride film to the polysilicon film ($Si_3N_4$/P—Si) and the selectivity of the silicon nitride film to the silicon oxide film ($Si_3N_4$/$SiO_2$) are the maximum.

Figure 17:
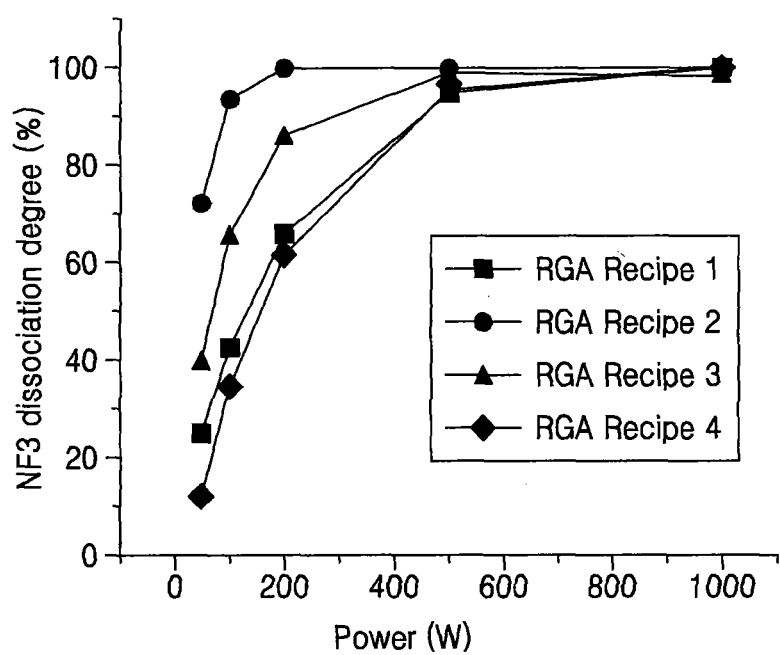
FIG. 17 is a graph showing a degree of dissociation of nitrogen trifluoride as a function of applied power.

FIG. 17 is a graph showing a degree of dissociation of nitrogen trifluoride according to applied power. In the graph of FIG. 17, the x-axis denotes the power of an applied electromagnetic wave in units of watts (W). The y-axis denotes a degree of dissociation of $NF_3$ as a percentage (%).

Alternatively, RGA is an abbreviation of a residual gas analyzer, and RGA Recipe 1 to RGA Recipe 4 mean that the process conditions slightly differ.

As shown in the graph of FIG. 17, regardless of the process condition, when the power is equal to or greater than 500 W, it may be seen that a degree of dissociation of $NF_3$ reaches almost 100%. Also, when the power is equal to or greater than 200 W, it may be seen that a degree of dissociation of $NF_3$ is equal to or greater than 50% regardless of the process conditions. Accordingly, by adjusting the flow rate of $H_2$ by taking into account the degree of dissociation of $NF_3$ according to the power of the process conditions, in the etching process using plasma, the etch rate and selectivity of the silicon nitride film may be optimized or maximized.

In detail for example, when the degree of dissociation of $NF_3$ is close to 100% by applying high power of more than 1000 W, it is appropriate that the flow rate ratio between $NF_3$ and $H_2$ is 2:3. Accordingly, the etch rate and selectivity of the silicon nitride film may be optimized or maximized. However, when the degree of dissociation of $NF_3$ is about 50% by applying low power, a high selectivity and a high etch rate of the silicon nitride film may be embodied by setting the flow rate ratio between $NF_3$ and $H_2$ to be about 4:3.

When $H_2$ is not used in the related art, a degree of dissociation is lowered to obtain a high selectivity. Accordingly, obtaining a high etch rate is sacrificed instead. Otherwise, to obtain a high etch rate, selectivity is sacrificed. However, in the etching method using plasma according to the present exemplary embodiment, since a high selectivity may be maintained not only at low power but also at high power as $H_2$ is supplied, a high selectivity and a high etch rate may be simultaneously achieved.

Figure 18:
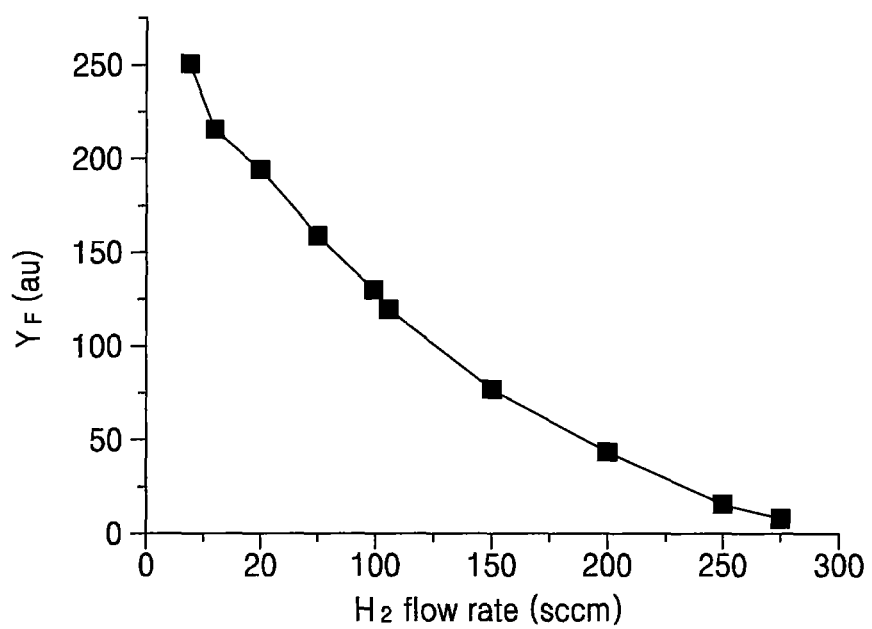
FIG. 18 is a graph showing the amount of fluorine (F) radicals as a function of the amount of $H_2$.

FIG. 18 is a graph showing the amount of F radicals according to the amount of $H_2$. In FIG. 18, the x-axis denotes the flow rate of $H_2$ in units of sccm, and the y-axis denotes a density ($Y_F$) of F radicals in units of arbitrary units (au).

For reference, the plasma generated by applying power to the process gas $NF_3$ may include F, NF, or $NF_2$ radicals. The NF and $NF_2$ radicals may act only for etching of the silicon nitride film. However, the F radicals may act not only for etching of the silicon nitride film but also for etching of the polysilicon film and the silicon oxide film. Accordingly, although F radicals are generated much to obtain a high etch rate, the F radicals are generated less to increase selectivity with respect to the polysilicon film and the silicon oxide film. In this state, when $H_2$ is supplied, the F radicals may be removed by the reaction H+F→HF, and the F radicals of a main etchant of the silicon oxide film and the polysilicon film may be removed.

As shown in FIG. 18, as the flow rate of $H_2$ increases, it may be seen that the amount of F radicals gradually decreases. As a result, when an appropriate flow rate of $H_2$ is supplied, a high etch rate and a high selectivity of the silicon nitride film may be simultaneously obtained.

Accordingly, in the etching method using plasma according to the present exemplary embodiment, since the flow rate of $H_2$ is adjusted based on the result of the graph of FIG. 18 and by taking into account the flow rate ratio, the process conditions, and the dissociation degree of $NF_3$ with respect to power according to the results of graphs of FIG. 15A to 17, the etch rate and selectivity of the silicon nitride film may be optimized or maximized in the etching process using plasma.

Figure 19:
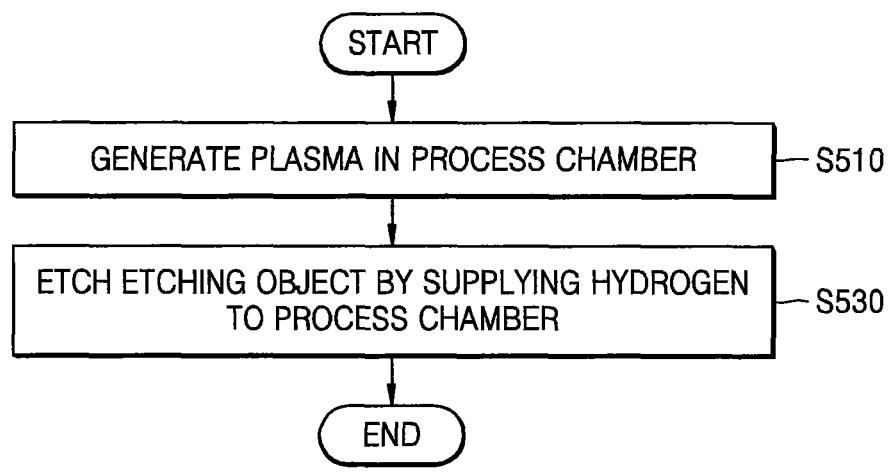
FIG. 19 is a flowchart illustrating an etching method using plasma, according to another exemplary embodiment.

FIG. 19 is a flowchart illustrating an etching method using plasma, according to another exemplary embodiment.

Referring to FIG. 19, in the etching method using plasma according to the present exemplary embodiment, first, plasma is generated in the process chamber (S510). In the etching method using plasma according to the present exemplary embodiment, plasma may be directly generated in the process chamber by supplying a process gas to the process chamber without using the RPS and by applying power to the process chamber. For example, plasma may be directly generated in the process chamber by using the direct plasma technology such as CCP or ICP.

Next, the etching object is etched by supplying hydrogen to the process chamber (S530). The hydrogen may be supplied to the process chamber through various paths. For example, the hydrogen may be supplied to the process gas supply path, the shower head, or the process chamber through the entrance directly connected to the process chamber. The supply of hydrogen to the process chamber is described in detail with reference to FIG. 20. In addition, since plasma is already present or generated in the process chamber, the plasma does not need to be separately supplied.

In the etching method using plasma according to the present exemplary embodiment, since the etching object is etched by supplying hydrogen to the process chamber and using plasma even if the direct plasma technology does not use the RPS, the etching efficiency with respect to the etching object, for example, an etch rate and a selectivity of the etching object, may be increased.

Figure 20:
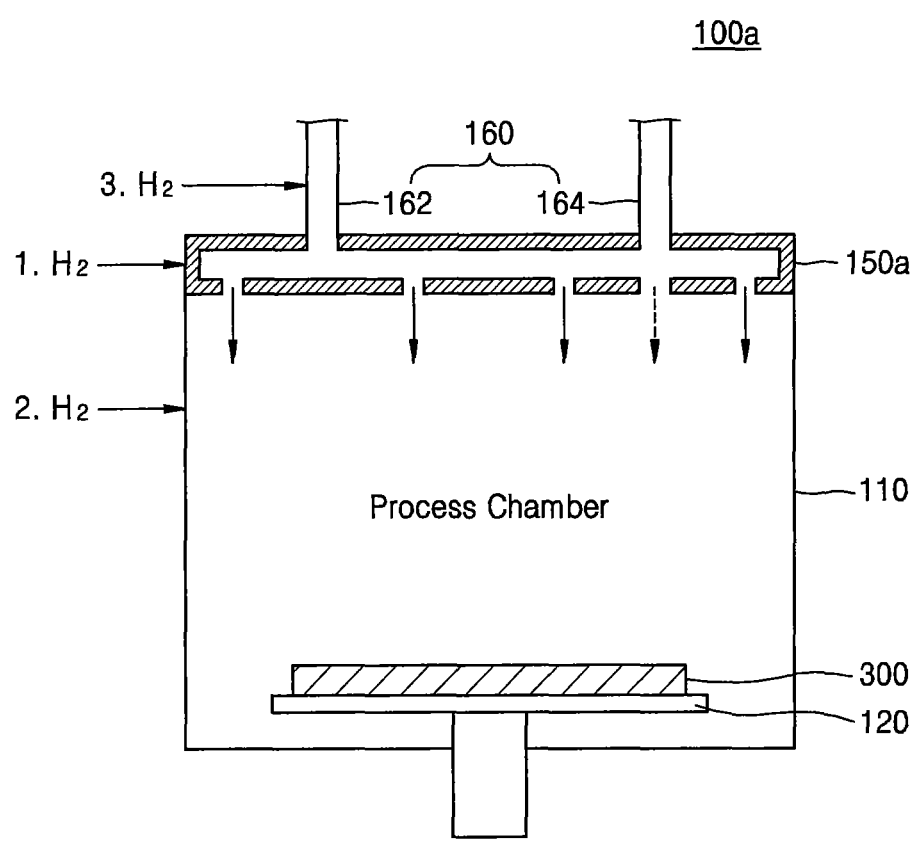
FIG. 20 is a schematic diagram of a structure of a semiconductor device fabrication apparatus illustrating supplying hydrogen to a process chamber in the etching method of FIG. 19.

FIG. 20 is a schematic diagram illustrating a structure of a semiconductor device fabrication apparatus 100a to show a concept of supplying hydrogen to a process chamber in the etching method using plasma of FIG. 19. For convenience of explanation, the descriptions provided above with reference to FIG. 11 are briefly provided or omitted.

Referring to FIG. 20, in the etching method using plasma according to the present exemplary embodiment, the semiconductor device fabrication apparatus 100a having no RPS may be used. The semiconductor device fabrication apparatus 100a may include the process chamber 110, the stage 120, and the shower head portion 150a. The process chamber 110, the stage 120, and the shower head portion 150a are the same as those described with reference to FIG. 11.

Hydrogen may be supplied to the process chamber 110 through various paths. For example, in the first path indicated by "1. $H_2$," hydrogen may be supplied to the shower head portion 150a. In the second path indicated by "2. $H_2$," hydrogen may be supplied directly to the process chamber 110 through the entrance directly connected to the process chamber 110. In the third path indicated by "3. $H_2$," hydrogen may be supplied to the shower head portion 150a with the process gases through the process gas supply path 160. For reference, the first path and the third path are similar to each other in that hydrogen is supplied to the shower head portion 150a. However, in the first path, hydrogen is supplied to the shower head portion 150a through a path that is different from the path for supplying the process gases and, in the third path, hydrogen is supplied to the shower head portion 150a through the same path as the path for supplying the process gases.

In the etching method using plasma according to the present exemplary embodiment, hydrogen may be supplied to the process chamber 110 through any one of the above-described three paths or through two or more paths.

Figure 21:
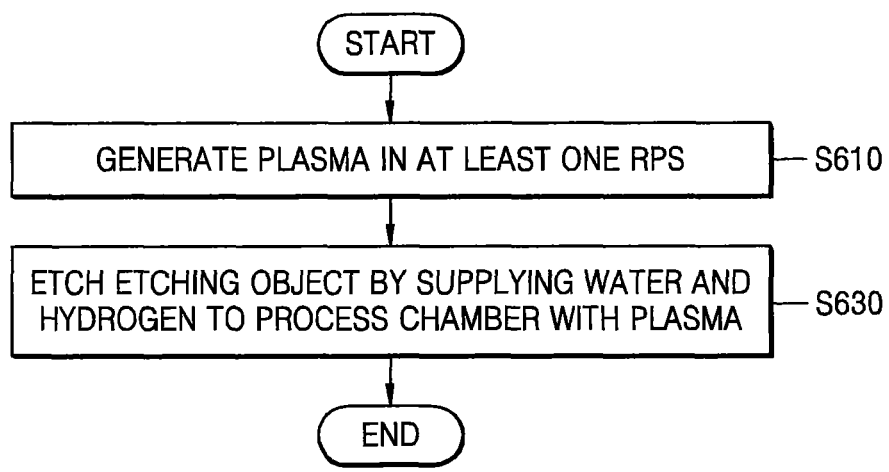
FIG. 21 is a flowchart illustrating an etching method using plasma, according to another exemplary embodiment.

FIG. 21 is a flowchart illustrating an etching method using plasma, according to another exemplary embodiment. For convenience of explanation, the descriptions provided above with reference to FIGS. 1 and 12 are briefly provided or omitted.

Referring to FIG. 21, in the etching method using plasma according to the present exemplary embodiment, first, plasma is generated in at least one RPS (S610). The generation of plasma in the RPS is the same as that described with reference to FIG. 1.

Next, water and hydrogen are supplied with plasma to the process chamber, thereby etching the etching object (S630). The etching method using plasma according to the present exemplary embodiment may be different from the etching method using plasma of FIG. 1 or 12 in that water and hydrogen are supplied with plasma to the process chamber. The water and hydrogen may be supplied to the process chamber through various paths, which is described below in detail with reference to FIGS. 22 to 25.

In the etching method using plasma according to the present exemplary embodiment, since the etching object is etched by supplying water and hydrogen to the process chamber with plasma, the etching efficiency with respect to the etching object, for example, an etch rate and a selectivity of the etching object, may be increased. In particular, when the fluorine (F)-based process gas is used, as water and hydrogen are supplied to the process chamber with plasma, an etch rate and a selectivity of the etching object may be increased. The method of etching the etching object by supplying water and hydrogen with plasma may have a combined effect of the method of etching the etching object by supplying water with plasma and the method of etching the etching object by supplying hydrogen with plasma. For example, the effect of supplying water and plasma, described with reference to FIGS. 6 and 7, and the effect of supplying hydrogen and plasma, described with reference to FIGS. 15A to 16B, may be compositely obtained. In addition, hydrogen may be supplied by taking into account the optimal flow rate ratio with respect to $NF_3$ according to Equation 1.

In the etching method using plasma according to the present exemplary embodiment, since plasma is generated in the at least one RPS and plasma is supplied to the process chamber with water and hydrogen to etch the etching object, the etching efficiency with respect to the etching object, for example, an etch rate and a selectivity of the etching object, may be increased.

Figure 22:
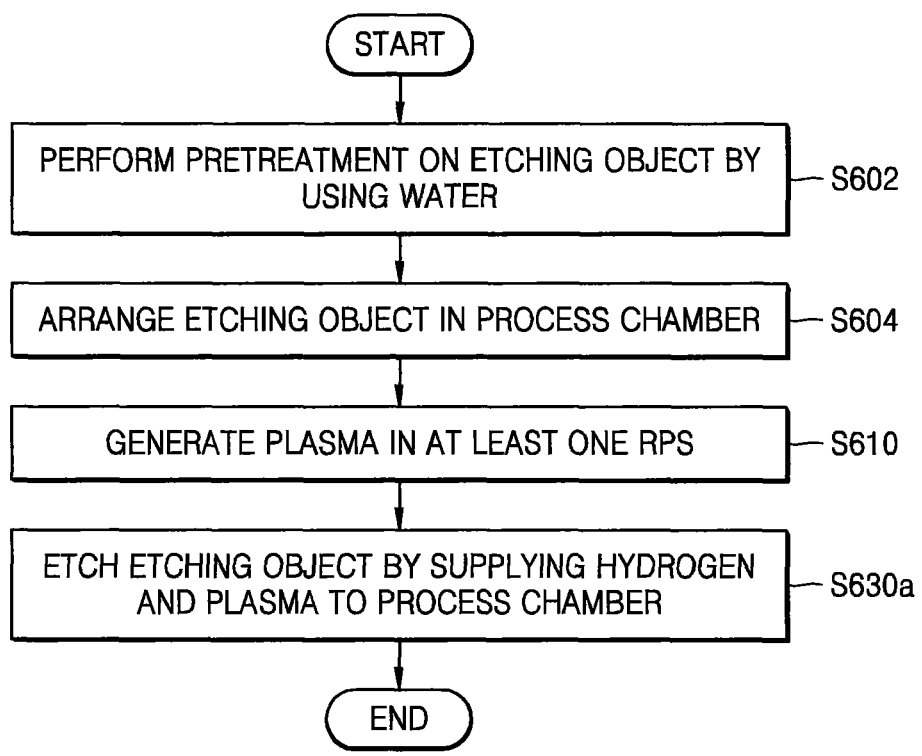
FIG. 22 is a flowchart illustrating in detail the etching method of FIG. 21.

FIG. 22 is a flowchart illustrating in detail the etching method using plasma of FIG. 21. For convenience of explanation, the descriptions provided above with reference to FIGS. 2 and 13 are briefly provided or omitted.

Referring to FIG. 22, in the etching method using plasma according to the present exemplary embodiment, first, a pretreatment using water is performed on the etching object (S602). The pretreatment using water on the etching object is the same as that described with reference to FIGS. 2 to 3B.

Next, the pretreated etching object is arranged in the process chamber (S604). The etching object may be arranged on the upper surface of the stage (see 120 of FIG. 23) located in a lower portion of the process chamber.

After arranging the etching object in the process chamber, at least one RPS generates plasma (S610). The generation of plasma in the RPS is the same as that described with reference to FIG. 1.

Then, hydrogen and plasma are supplied to the process chamber and thus the etching object is etched (S630a). Although in FIG. 21 water and hydrogen are supplied to the process chamber with plasma, according to the present exemplary embodiment, water may be considered to be already supplied to the process chamber when the pretreated etching object is arranged in the process chamber. In the etching operation (S630a), only the hydrogen and plasma are supplied. In other words, the etching operation (S630) of FIG. 21 may correspond to both an arrangement operation (S604) and an etching operation (S630a) of the present exemplary embodiment.

The method of supplying hydrogen to the process chamber with plasma is substantially the same as that described with reference to FIGS. 12 to 14. For example, hydrogen may be supplied to the process chamber through various paths. According to the present exemplary embodiment, the method of pretreating the etching object by using water and supplying hydrogen to the process chamber through various paths is described in detail by using the semiconductor device fabrication apparatus with reference to FIG. 23.

Figure 23:
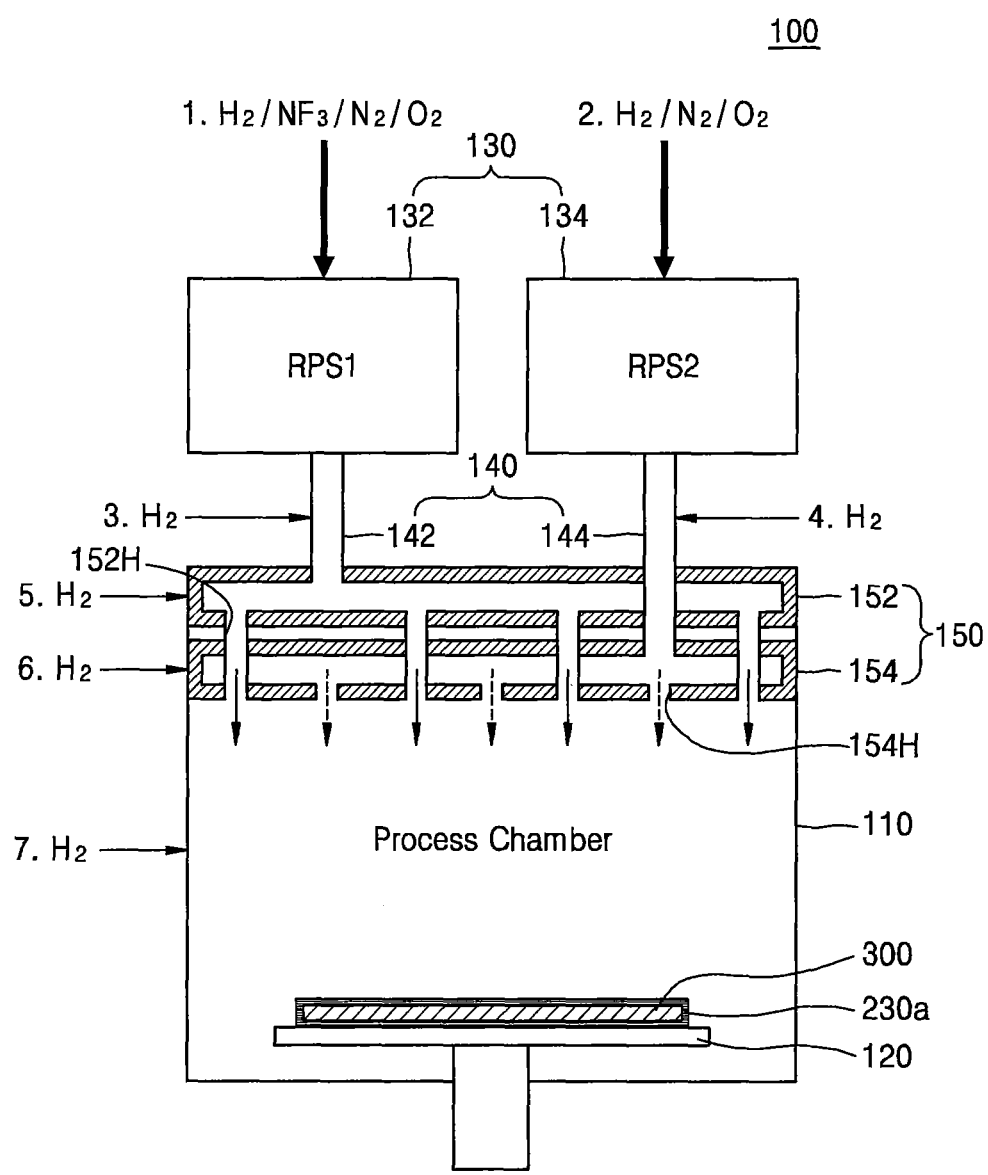
FIG. 23 is a schematic diagram of a structure of a semiconductor device fabrication apparatus having an RPS to show a concept of supplying water and hydrogen to a process chamber in the etching method of FIG. 22.

FIG. 23 is a schematic diagram illustrating a structure of a semiconductor device fabrication apparatus 100 having an RPS to show a concept of supplying water and hydrogen to a process chamber in the etching method using plasma of FIG. 22. For convenience of explanation, the descriptions provided above with reference to FIG. 14 is briefly provided or omitted.

Referring to FIG. 23, in the etching method using plasma according to the present exemplary embodiment, the semiconductor device fabrication apparatus 100 having two RPS's may be used. The semiconductor device fabrication apparatus 100 may include the process chamber 110, the stage 120, the RPS portion 130, and the shower head portion 150. The process chamber 110, the stage 120, the RPS portion 130, the shower head portion 150, and the etching object 300 are the same as those described with reference to FIG. 5. Also, the first and second process conditions, the first electromagnetic wave of the first power, the second electromagnetic wave of the second power, the first and second process gases respectively used for the first RPS 132 and the second RPS 134, and the first and second plasmas respectively generated from the first RPS 132 and the second RPS 134 are the same as those described with reference to FIG. 5.

In the etching method using plasma according to the present exemplary embodiment, first, before the plasma etching process is performed, the etching object 300 that has been pretreated with water may be arranged on the upper surface of the stage 120. In the pretreatment of the etching object 300 with water, as described with reference to FIGS. 2 to 3B, the surface of the etching object 300 may be coated with the vapor 230a through a method of keeping an etching object with water in a sealed container or spraying steam onto an etching object.

After the etching object 300 having been pretreated using water is arranged on the upper surface of the stage 120, hydrogen and plasma are supplied to the process chamber 110 so that the etching process may be performed using plasma. The hydrogen may be supplied to the process chamber 110 through various paths. For example, as illustrated in FIG. 23, the hydrogen may be supplied to the process chamber 110 through at least one of the seven paths, which is the same as that described with reference to FIG. 14.

In the etching method using plasma according to the present exemplary embodiment, since the first and second plasma are independently generated using two RPS's that are arranged to be spaced apart from the process chamber 110 and supplied to the process chamber 110, as described with reference to FIG. 5, the quantity and type of plasma may be independently and precisely controlled in the semiconductor device fabrication process such as deposition, etching, cleaning, etc. Accordingly, in the semiconductor device fabrication process, for example, the etching of the etching object 300 in the etching process, may be controlled to be performed uniformly and precisely.

Also, in the etching method using plasma according to the present exemplary embodiment, since water is supplied through the pretreatment of the etching object, plasma is generated in at least one RPS and supplied to the process chamber, and hydrogen is supplied to the process chamber through various paths, the etching efficiency with respect to the etching object, for example, an etch rate and a selectivity of the etching object, may be increased.

Figure 24:
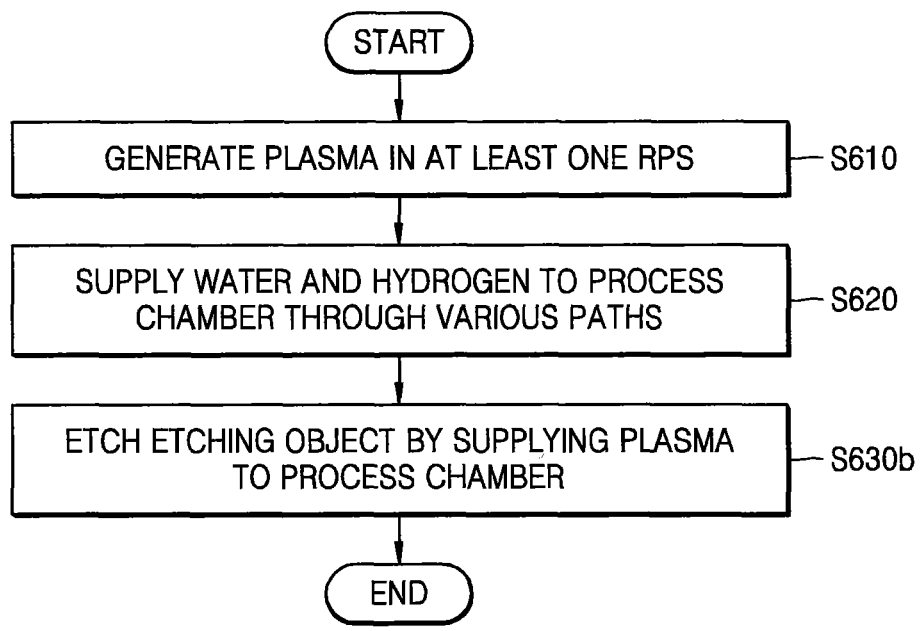
FIG. 24 is a flowchart illustrating in detail the etching method of FIG. 21.

FIG. 24 is a flowchart illustrating in detail the etching method using plasma of FIG. 21. For convenience of explanation, the descriptions provided above with reference to FIGS. 4 and 13 are briefly provided or omitted.

Referring to FIG. 24, in the etching method using plasma according to the present exemplary embodiment, first, plasma is generated in at least one RPS (S610). The generation of plasma in the RPS is the same as that described with reference to FIG. 1.

Next, water and hydrogen are supplied to the process chamber through various paths (S620). The water may be supplied to the process chamber in the form of vapor. For example, water and hydrogen may be supplied to at least one RPS. Also, water and hydrogen may be supplied to the plasma supply path between the at least one RPS and the shower head, or to the shower head. The water and hydrogen supplied to the at least one RPS, the plasma supply path, or the shower head may be finally supplied to the process chamber. Alternatively, in addition to the above methods, the water and hydrogen may be directly supplied to the process chamber through the entrance directly connected to the process chamber. The water and hydrogen may be supplied through different paths, thus not being supplied simultaneously through any one path.

In addition, although FIG. 24 illustrates that water and hydrogen are supplied to the process chamber after plasma is generated, the water and hydrogen may be supplied to the process chamber before or in the middle of the generation of plasma. The method of supplying water and hydrogen to the process chamber is described in detail by using semiconductor device fabrication apparatus with reference to FIG. 25.

After the supply of water and hydrogen to the process chamber (S620), plasma is supplied to the process chamber and the etching object is etched (S630b). Alternatively, plasma may be supplied together with water and hydrogen or separately from water and hydrogen. For example, in the supply of water and hydrogen to the process chamber (S620), when the water and hydrogen are supplied to at least one of the RPS, the plasma supply path, and the shower head, the plasma may be supplied to the process chamber with water and hydrogen. However, when water and hydrogen are supplied through the entrance directly connected to the process chamber, plasma may be supplied to the process chamber separately from water and hydrogen. Furthermore, any one of water and hydrogen may be supplied with plasma and the other one may be separately supplied. Also, water, hydrogen, and plasma may be separately supplied from one another.

Alternatively, as described above about the sequence between the generation of plasma and the supply of water and hydrogen, water and hydrogen may be supplied before, in the middle of, or after the generation of plasma. Accordingly, the supply of water and hydrogen may be performed before, in the middle of, or after the supply of plasma to the process chamber. Also, the supply of water and hydrogen may be maintained with the supply of plasma or may be discontinued after being supplied for a predetermined time, during the etching process. Furthermore, water and hydrogen may be intermittently supplied during the etching process. Also, each of water and hydrogen may be supplied in the same order or pattern, or in a totally different order or pattern.

In the etching method using plasma according to the present exemplary embodiment, plasma is generated in at least one RPS and water and hydrogen are supplied with plasma to the process chamber through various paths, thereby etching the etching object, and the etching efficiency with respect to the etching object, for example, an etch rate and a selectivity of the etching object, may be increased.

Figure 25:
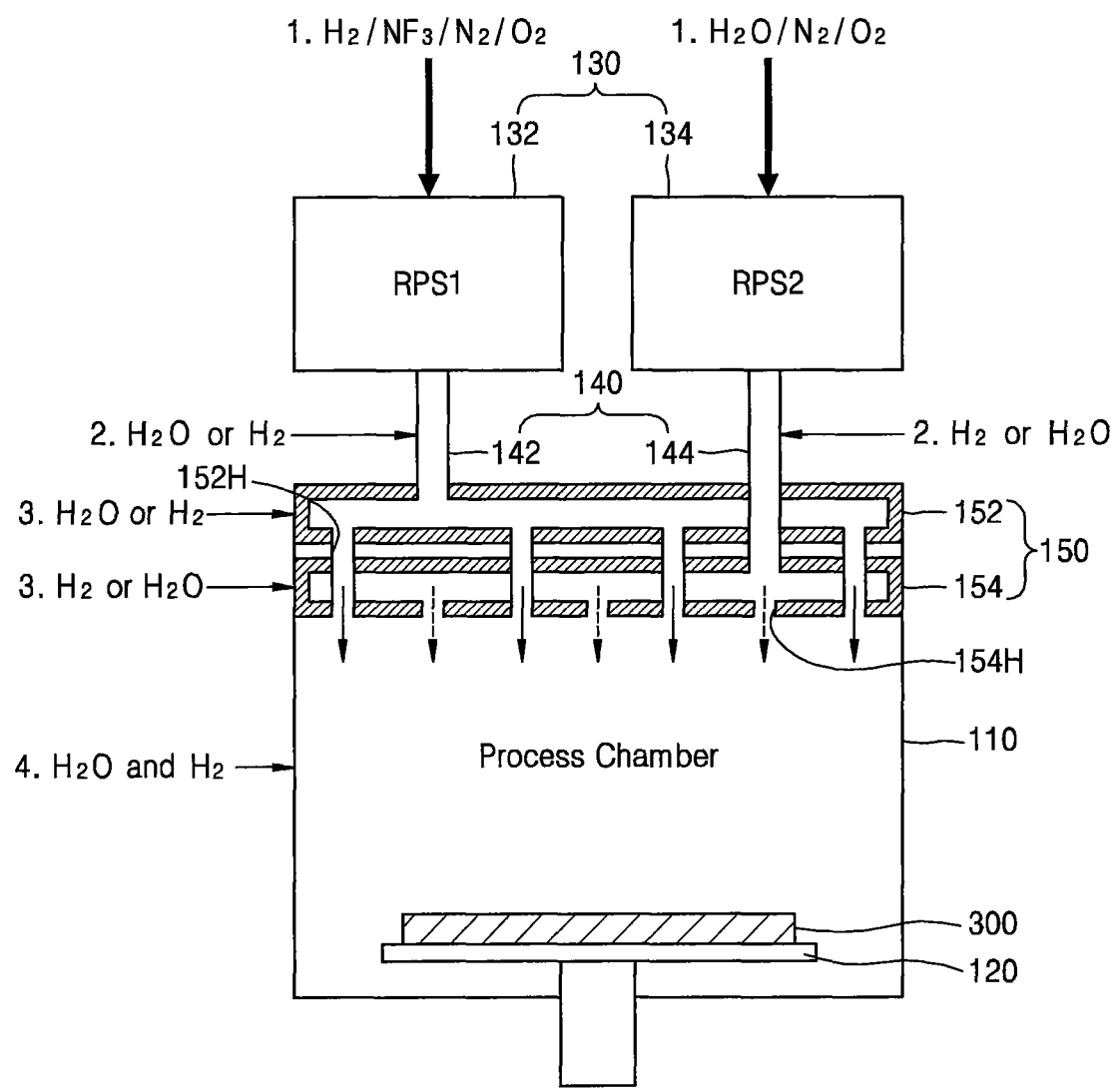
FIG. 25 is a schematic diagram of a structure of a semiconductor device fabrication apparatus having an RPS to show a concept of supplying water and hydrogen to a process chamber in the etching method of FIG. 24.

FIG. 25 is a schematic diagram illustrating a structure of a semiconductor device fabrication apparatus 100 having an RPS to show a concept of supplying water and hydrogen to a process chamber in the etching method using plasma of FIG. 24. For convenience of explanation, the descriptions provided above with reference to FIGS. 5 and 14 are briefly provided or omitted.

Referring to FIG. 25, in the etching method using plasma according to the present exemplary embodiment, the semiconductor device fabrication apparatus 100 having two RPS's may be used. The semiconductor device fabrication apparatus 100 may include the process chamber 110, the stage 120, the RPS portion 130, and the shower head portion 150. The process chamber 110, the stage 120, the RPS portion 130, the shower head portion 150, and the etching object 300 are the same as those described with reference to FIG. 5. Also, the first and second process conditions, the first electromagnetic wave of the first power, the second electromagnetic wave of the second power, the first and second process gases respectively used for the first RPS 132 and the second RPS 134, and the first and second plasma respectively generated from first RPS 132 and the second RPS 134 are the same as those described with reference to FIG. 5.

In the etching method using plasma according to the present exemplary embodiment, water and hydrogen are supplied to the process chamber 110 through various paths. For example, in the first path indicated by "1. $H_2$/$NF_3$/$O_2$/$N_2$" and "1. $H_2O$/$N_2$/$O_2$/$N_2$," hydrogen may be supplied to the first RPS 132 with $NF_3$, $N_2$, $O_2$, etc. that are the first process gas, and water may be supplied to the second RPS 134 with $N_2$, $O_2$, etc. that are the second process gas. Alternatively, in the first path, water and hydrogen may be supplied to the opposite RPS's. In other words, water may be supplied to the first RPS 132 with the first process gas and hydrogen may be supplied to the second RPS 134 with the second process gas. Also, in some cases, both of water and hydrogen may be supplied to any one of the first RPS 132 and the second RPS 134.

As the second path indicated by "2. $H_2O$ or $H_2$" and "2. $H_2$ or $H_2O$," water may be supplied to the first supply path 142 with the first plasma from the first RPS 132, and hydrogen may be supplied to the second supply path 144 with the second plasma generated in the second RPS 134. In contrast, hydrogen may be supplied to the first supply path 142, and water may be supplied to the second supply path 144. In some cases, both of water and hydrogen may be supplied to any one of the first supply path 142 and the second supply path 144.

As the third path indicated by "3. $H_2O$ or $H_2$" and "3. $H_2$ or $H_2O$," water may be supplied to the first shower head 152 with the first plasma from the first RPS 132, and hydrogen may be supplied to the second shower head 154 with the second plasma generated in the second RPS 134. In contrast, hydrogen may be supplied to the first shower head 152, and water may be supplied to the second shower head 154. In some cases, both of water and hydrogen may be supplied to any one of the first shower head 152 and the second shower head 154.

Finally, in the fourth path indicated by "4. $H_2O$ and $H_2$," the water and hydrogen may be directly supplied to the process chamber 110 through the entrance directly connected to the process chamber.

Alternatively, in the etching method using plasma according to the present exemplary embodiment, water and hydrogen may be supplied to the process chamber 110 through any one or two or more paths of the above-described four paths. Also, water and hydrogen may be supplied through paths different from each other. For example, hydrogen may be supplied to the process chamber 110 through the RPS portion 130, and water may be directly supplied to the process chamber 110 through the entrance directly connected to the process chamber 110.

In the etching method using plasma according to the present exemplary embodiment, since the first and second plasma are independently generated by using the two RPS's arranged spared apart from the process chamber 110 and supplied to the process chamber 110, in the semiconductor device fabrication process such as deposition, etching, cleaning, etc., the quantity and type of plasma may be independently and precisely controlled. Accordingly, in the semiconductor device fabrication process, for example, in the etching process, etching on the etching object 300 may be uniformly and precisely controlled.

Also, in the etching method using plasma according to the present exemplary embodiment, since plasma is generated in at least one RPS and the generated plasma is supplied to the process chamber, and also water and hydrogen are supplied to the process chamber through various paths, the etching efficiency with respect to the etching object, for example, an etch rate and a selectivity of the etching object, may be remarkably increased.

Figure 26:
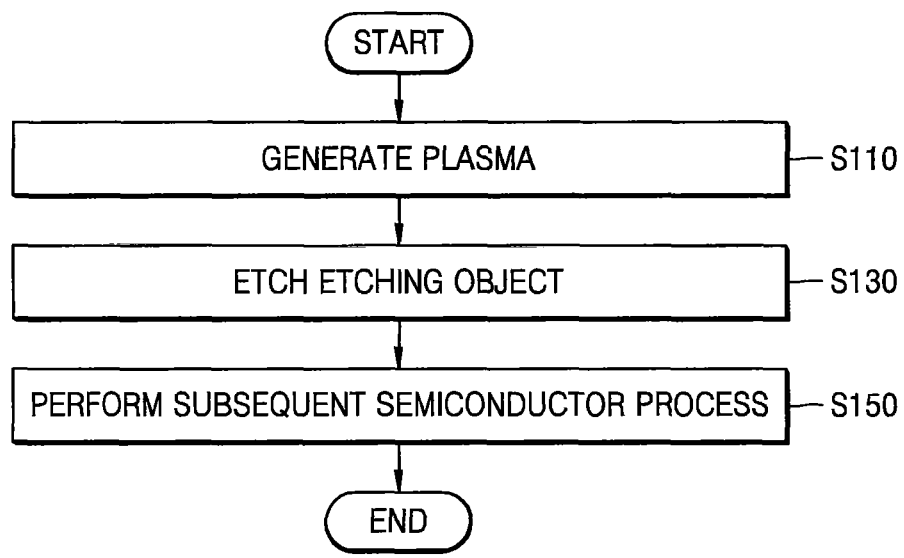
FIG. 26 is a flowchart for explaining a method of fabricating a semiconductor device including an etching method using plasma, according to an exemplary embodiment.

FIG. 26 is a flowchart illustrating a method of fabricating a semiconductor device including an etching method using plasma, according to an exemplary embodiment.

Referring to FIG. 26, according to the present exemplary embodiment of the method of fabricating a semiconductor device, first, plasma is generated (S110). The generation of plasma may be the generation of plasma in at least one RPS described in FIGS. 1, 2, 4, 12, 13, 21, 22, and 24, or the direct generation of plasma in the process chamber described in FIGS. 10 and 19. Since the generation of plasma is already described, detailed descriptions thereof are omitted.

Next, the etching object is etched (S130). In the operation of etching the etching object (S130), at least one of water and hydrogen may be supplied to the process chamber with plasma and thus the etching object may be etched. The supply of water may include the supply of water through a pretreatment and the supply of water in the form of vapor. The supply of water in the form of vapor and the supply of hydrogen may include the supply of water and hydrogen to the process chamber through various paths. Since the method of supplying at least one of water and hydrogen to the process chamber with plasma is described for the above-described various exemplary embodiments, detailed descriptions thereof are omitted.

Next, a subsequent semiconductor process is performed (S150). The subsequent semiconductor process may include various processes, for example, a deposition process, an etching process, an ion process, a cleaning process, etc. The deposition process may include various material layer forming processes such as CVD, sputtering, spin coating, etc. The etching process may be the above-described etching process using plasma or the etching process that does not use plasma. The ion process may include a process such as ion injection, diffusion, annealing, etc. Integrated circuits and wirings required for a semiconductor device may be formed by performing the subsequent semiconductor process.

Alternatively, the subsequent semiconductor process may include a packaging process in which a semiconductor device is mounted on a printed circuit board (PCB) and hermetically sealed using a sealing member. Also, the subsequent semiconductor process may include a test process of testing a semiconductor device or package. The semiconductor device or semiconductor package may be completed by performing the subsequent semiconductor process.

While the inventive concept has been particularly shown and described with reference to exemplary embodiments thereof, it will be understood that various changes in form and details may be made therein without departing from the spirit and scope of the following claims.

In the etching method using plasma according to the present inventive concept, plasma is generated in at least one RPS and at least one of water and hydrogen is supplied to the process chamber with plasma, thereby etching the etching object, the etching efficiency with respect to the etching object, for example, an etch rate and a selectivity of the etching object, may be increased.

Also, in the etching method using plasma according to the present inventive concept, plasma is directly generated in the process chamber and at least one of water and hydrogen is supplied to the process chamber, thereby etching the etching object, the etching efficiency with respect to the etching object may be increased as well.

Furthermore, in the etching method using plasma according to the present inventive concept, when two or more RPS's are used, since plasmas are independently generated in the two or more RPS's and supplied to the process chamber, in the etching and/or cleaning process, the quantity and type of plasma may be independently and precisely controlled. Accordingly, since the etching and/or cleaning of the etching object may be uniformly and precisely controlled, and plasma is supplied to the process chamber with at least one of water and hydrogen, the etching efficiency with respect to the etching object may be improved.

What is claimed is:

1. An etching method using plasma, the method comprising:
    generating plasma by supplying process gases to at least one remote plasma source (RPS) and applying power to the at least one RPS; and
    etching an etching object by supplying water ($H_2O$) and the plasma to a process chamber; wherein the water ($H_2O$) is supplied to the process chamber without being supplied to the at least one RPS and the water is supplied during a pretreatment step performed on the etching object before an etching process.

2. The method of claim 1, wherein the water is further supplied in vapor form during the etching process.

3. The method of claim 1, wherein the pretreatment step is performed by placing the etching object with the water in a sealed space or spraying steam toward the etching object.

4. The method of claim 1, wherein the at least one RPS comprises at least two RPS's, and the water is supplied, in vapor form, to at least one of two paths between the RPS's and the process chamber, a shower head arranged in an upper portion of the inside of the process chamber, and an entrance connected to the process chamber.

5. An etching method using plasma, the method comprising:
    generating plasma by supplying process gases to at least one remote plasma source (RPS) and applying power to the at least one RPS; and
    etching an etching object by supplying hydrogen ($H_2$) and the plasma to a process chamber;
    wherein the hydrogen is supplied to the process chamber without being supplied to the at least one RPS.

6. The method of claim 5, wherein the at least one RPS comprises at least two RPS's, and the hydrogen is supplied to at least one of two paths between the RPS's and the process chamber, a shower head arranged in an upper portion of an inside of the process chamber, and an entrance connected to the process chamber.

7. The method of claim 6, wherein supplying process gases comprises supplying nitrogen trifluoride ($NF_3$) to at least one of the RPS's, and wherein hydrogen ($H_2$) is supplied to satisfy the equation, $$[NF_3]*D:[H_2]=2:3,$$

wherein "$[NF_3]$" denotes a flow rate of $NF_3$, "$[H_2]$" denotes a flow rate of $H_2$, and "D" denotes a degree of dissociation of $NF_3$.

8. A method of fabricating a semiconductor device, the method comprising:
    generating plasma by supplying process gases to at least one remote plasma source (RPS) or a process chamber and applying power to the at least one RPS or the process chamber;
    etching an etching object in the process chamber by using at least one of water ($H_2O$) and hydrogen ($H_2$), and the plasma, wherein at least one of the water ($H_2O$) and hydrogen is supplied to the process chamber without being supplied to the at least one RPS; and
    performing a subsequent semiconductor process on the etching object,
    wherein the plasma is generated in the at least one RPS, the at least one RPS comprises two RPS's, and
    one or more of the water or hydrogen is supplied to at least one path between the two RPS's and the process chamber, a shower head arranged in an upper portion of the process chamber, or an entrance connected to the process chamber.

9. The method of claim 8, wherein the water and the hydrogen are supplied to the process chamber, and
    the water is supplied to the process chamber during a pretreatment step of the etching object before an etching process or in vapor form during the etching process.

10. The method of claim 8, wherein supplying the process gases comprises supplying nitrogen trifluoride ($NF_3$), and hydrogen ($H_2$) to satisfy the equation, $$[NF_3]*D:[H_2]=2:3,$$

wherein "$[NF_3]$" denotes a flow rate of $NF_3$, "$[H_2]$" denotes a flow rate of $H_2$, and "D" denotes a degree of dissociation of $NF_3$.

11. The method of claim 8, wherein etching the etching object comprises selectively etching a silicon nitride ($Si_3N_4$) film and at least one of a polysilicon (p-Si) film and a silicon oxide ($SiO_2$) film, the silicon nitride ($Si_3N_4$) film.

12. The method of claim 8, wherein the two RPS's comprise a first RPS and a second RPS, and the at least one path between the two RPS's comprises a first path between the first RPS and the process chamber, the shower head arranged in the upper portion of the process chamber, and the entrance connected to the process chamber, and a second path between the second RPS and the process chamber, the shower head arranged in an upper portion of the process chamber, and the entrance connected to the process chamber, wherein one or more of the water or hydrogen is supplied to the first path and one or more of the water or hydrogen is supplied to the second path.

* * * * *